US012638768B2

(12) United States Patent
Tomiga et al.

(10) Patent No.: US 12,638,768 B2

(45) Date of Patent: May 26, 2026

(54) METHOD FOR PRODUCING ACTINIC RAY-SENSITIVE OR RADIATION-SENSITIVE RESIN COMPOSITION, PATTERN FORMATION METHOD, AND METHOD FOR MANUFACTURING ELECTRONIC DEVICE

(71) Applicant: FUJIFILM Corporation, Tokyo (JP)

(72) Inventors: Takamitsu Tomiga, Haibara-gun (JP); Kohei Higashi, Haibara-gun (JP); Fumihiro Yoshino, Haibara-gun (JP); Yuma Kurumisawa, Haibara-gun (JP); Takumi Tanaka, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 869 days.

(21) Appl. No.: 17/902,353

(22) Filed: Sep. 2, 2022

(65) Prior Publication Data

US 2023/0028463 A1 Jan. 26, 2023

Related U.S. Application Data

(63) Continuation of application No. PCT/JP2021/007602, filed on Mar. 1, 2021.

(30) Foreign Application Priority Data

Mar. 30, 2020 (JP) ................................. 2020-059722

(51) Int. Cl.
*G03F 7/004* (2006.01)

(52) U.S. Cl.
CPC .......... *G03F 7/0045* (2013.01); *G03F 7/0048* (2013.01)

(58) Field of Classification Search
CPC ..................................................... G03F 7/0048
See application file for complete search history.

(56) References Cited

U.S. PATENT DOCUMENTS

2009/0102089 A1 4/2009 Chen et al.
2011/0300482 A1* 12/2011 Suzuki .................. C07C 381/12 430/326
2014/0242787 A1* 8/2014 Fujiwara ............... H01L 21/426 528/10

(Continued)

FOREIGN PATENT DOCUMENTS

CN 101374880 A 2/2009
CN 102317258 A 1/2012
JP 7-064284 A 3/1995
JP 10-232491 A 9/1998
JP 10-232492 A 9/1998
JP 2000-319691 A 11/2000
JP 2009-237531 A 10/2009

(Continued)

OTHER PUBLICATIONS

Communication dated May 9, 2023 issued by the Japanese Patent Office in application No. 2022-511671.

(Continued)

*Primary Examiner* — Mark F. Huff
*Assistant Examiner* — Anna Malloy
(74) *Attorney, Agent, or Firm* — Sughrue Mion, PLLC

(57) ABSTRACT

A method for producing an actinic ray-sensitive or radiation-sensitive resin composition, comprising: preparing an intermediate solution which includes a photoacid generator and a solvent; and mixing the intermediate solution with at least a resin to prepare an actinic ray-sensitive or radiation-sensitive resin composition having a viscosity of 10 mPa·s or more.

7 Claims, 1 Drawing Sheet

(56) References Cited

U.S. PATENT DOCUMENTS

2018/0299777 A1* 10/2018 Tomiga .................... G03F 7/168
2020/0123295 A1 4/2020 Takahashi et al.

FOREIGN PATENT DOCUMENTS

| | | | |
|---|---|---|---|
| JP | 4954576 | B2 | 6/2012 |
| JP | 2013-120344 | A | 6/2013 |
| JP | 2014-071373 | A | 4/2014 |
| WO | 2019/004162 | A1 | 1/2019 |

OTHER PUBLICATIONS

Korean Office Action dated Apr. 1, 2024 in Application No. 10-2022-7031310.

Chinese Office Action dated Dec. 31, 2024 in Application No. 202180021154.7.

Japanese Office Action issued Oct. 3, 2023 in Application No. 2022-511671.

International Search Report dated May 11, 2021 issued by the International Searching Authority in Application No. PCT/JP2021/007602.

Written Opinion dated May 11, 2021 issued by the International Searching Authority in Application No. PCT/JP2021/007602.

International Preliminary Report on Patentability dated Sep. 29, 2022 with a Translation of the Written Opinion of the International Searching Authority in Application No. PCT/JP2021/007602.

Chinese Office Action dated Jul. 19, 2025, issued in Chinese application No. 202180021154.7.

Chinese Office Action dated Jan. 26, 2026, issued in Chinese application No. 202180021154.7.

* cited by examiner

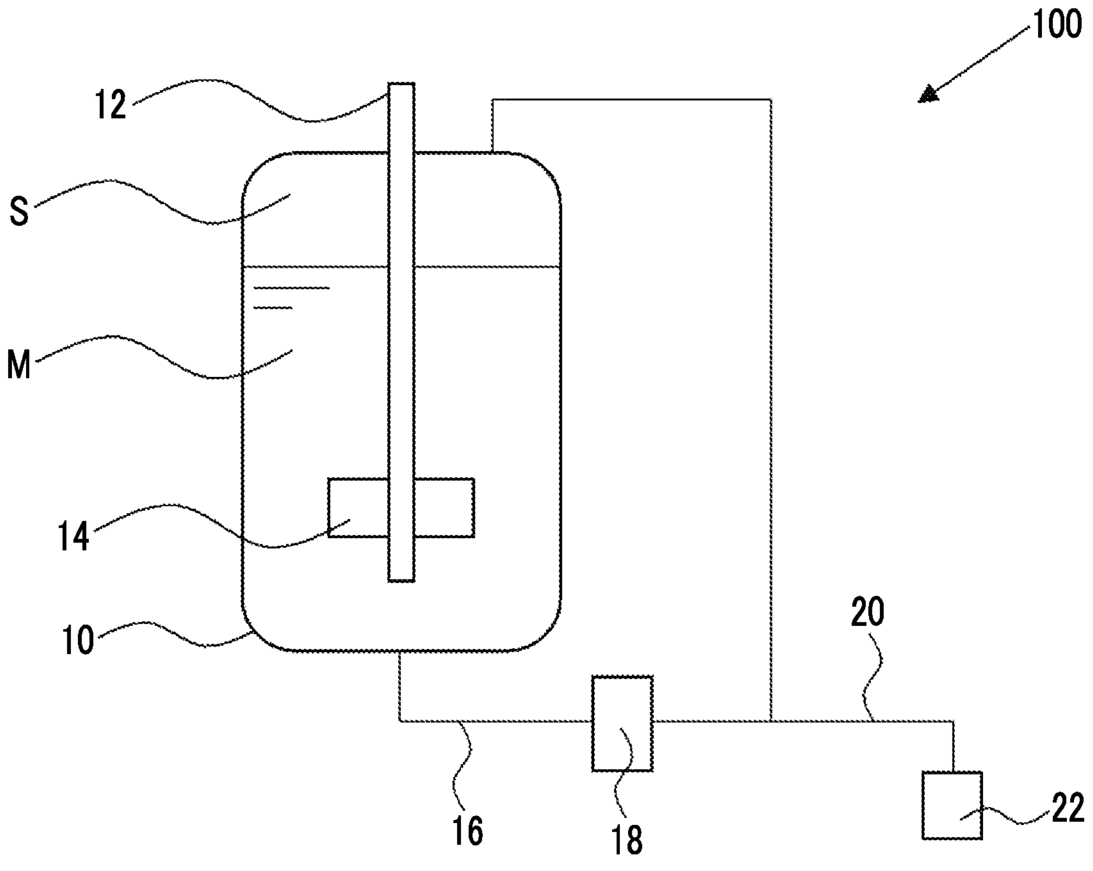
100
12
S
M
14
10
20
16
18
22

METHOD FOR PRODUCING ACTINIC RAY-SENSITIVE OR RADIATION-SENSITIVE RESIN COMPOSITION, PATTERN FORMATION METHOD, AND METHOD FOR MANUFACTURING ELECTRONIC DEVICE

CROSS-REFERENCE TO RELATED APPLICATIONS

This application is a Continuation of PCT International Application No. PCT/JP2021/007602 filed on Mar. 1, 2021, which claims priority under 35 U.S.C. § 119(a) to Japanese Patent Application No. 2020-059722 filed on Mar. 30, 2020. Each of the above application(s) is hereby expressly incorporated by reference, in its entirety, into the present application.

BACKGROUND OF THE INVENTION

1. Field of the Invention

The present invention relates to a method for producing an actinic ray-sensitive or radiation-sensitive resin composition, a pattern forming method, and a method for manufacturing an electronic device.

2. Description of the Related Art

In processes for manufacturing semiconductor devices such as an integrated circuit (IC) and a large scale integrated circuit (LSI), microfabrication by lithography using an actinic ray-sensitive or radiation-sensitive resin composition has been performed.

Examples of the lithography method include a method of forming a resist film with a radiation-sensitive resin composition including a resin having a polarity that increases by an acid, exposing the obtained film, and then developing the film.

By the way, in a process for manufacturing a semiconductor device, a thick resist film (for example, a thickness of 0.5 to 15 μm) may be used, depending on a step of application.

As a resist composition capable of forming such a resist film, for example, "a resist composition for forming a thick resist film having a film thickness of 1 to 15 μm, which is a positive resist composition having a resin component (A) having an alkali solubility that increases by the action of an acid and an acid generator component (B) that generates an acid by exposure, each component being dissolved in an organic solvent (S), in which the organic solvent (S) is a mixed solvent of 10% to 95% by mass of propylene glycol monomethyl ether and 5% to 90% by mass of another solvent (S2)", is disclosed in JP4954576B.

SUMMARY OF THE INVENTION

The present inventors have manufactured a resist composition for forming a thick resist film with reference to JP4954576B, and have conducted studies on the resist composition, leading to findings that there is room for further improvement for reducing a content of particles in the resist composition.

Therefore, an object of the present invention is to provide a method for producing an actinic ray-sensitive or radiation-sensitive resin composition in which a content of particles is reduced.

In addition, another object of the present invention is to provide a pattern forming method and a method for manufacturing an electronic device.

The present inventors have conducted intensive studies to accomplish the objects, and as a result, they have completed the present invention. That is, the present inventors have found that the objects can be accomplished by the following configurations.

[1] A method for producing an actinic ray-sensitive or radiation-sensitive resin composition, comprising:

preparing an intermediate solution which includes a photoacid generator and a solvent; and mixing the intermediate solution with at least a resin to prepare an actinic ray-sensitive or radiation-sensitive resin composition having a viscosity of 10 mPa·s or more.

[2] The method for producing an actinic ray-sensitive or radiation-sensitive resin composition as described in [1], in which a viscosity of the intermediate solution is 50 mPa·s or less. [3] The method for producing an actinic ray-sensitive or radiation-sensitive resin composition as described in [1] or [2], in which a difference in viscosities between the intermediate solution and the actinic ray-sensitive or radiation-sensitive resin composition having a viscosity of 10 mPa·s or more is 50 to 600 mPa·s.

[4] The method for producing an actinic ray-sensitive or radiation-sensitive resin composition as described in any one of [1] to [3], in which in preparing the intermediate solution, a solubility of the photoacid generator in 100 g of the solvent at 25° C. is 0.5 g or more.

[5] The method for producing an actinic ray-sensitive or radiation-sensitive resin composition as described in any one of [1] to [4], in which the solvent includes one or more solvents selected from the group consisting of propylene glycol monomethyl ether acetate, propylene glycol monomethyl ether, ethyl lactate, cyclohexanone, and cyclopentanone.

[6] The method for producing an actinic ray-sensitive or radiation-sensitive resin composition as described in any one of [1] to [5], in which the photoacid generator includes a compound represented by General Formula (ZI-5) which will be described later.

[7] A pattern forming method comprising:

forming a resist film on a support, by using an actinic ray-sensitive or radiation-sensitive resin composition obtained by the method for producing an actinic ray-sensitive or radiation-sensitive resin composition as described in any one of [1] to [6];

exposing the resist film; and developing the exposed resist film, by using a developer.

[8] A method for manufacturing an electronic device, comprising the pattern forming method as described in [7].

According to the present invention, it is possible to provide a method for producing an actinic ray-sensitive or radiation-sensitive resin composition in which a content of particles is reduced.

In addition, according to the present invention, it is possible to provide a pattern forming method and a method for manufacturing an electronic device.

BRIEF DESCRIPTION OF THE DRAWINGS

FIG. 1 shows a schematic view of an embodiment of a device used in a method for producing an actinic ray-sensitive or radiation-sensitive resin composition of an embodiment of the present invention.

DESCRIPTION OF THE PREFERRED EMBODIMENTS

Hereinafter, an example of a form for carrying out the present invention will be described.

In the present specification, a numerical value range expressed using "to" means a range that includes the preceding and succeeding numerical values of "to" as a lower limit value and an upper limit value, respectively.

In notations for a group (atomic group) in the present specification, in a case where the group is cited without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

The bonding direction of divalent groups cited in the present specification is not limited unless otherwise specified.

For example, in a compound represented by General Formula "L-M-N", M may be either *1-OCO—C(CN)=CH—*2 or *1-CH=C(CN)—COO—*2, assuming that in a case where M is —OCO—C(CN)=CH—, a position bonded to the L side is defined as *1 and a position bonded to the N side is defined as *2.

"(Meth)acryl" in the present specification is a generic term encompassing acryl and methacryl, and means "at least one of acryl or methacryl". Similarly, "(meth)acrylic acid" means "at least one of acrylic acid or methacrylic acid".

In addition, in the present specification, an "organic group" means a group including one or more carbon atoms.

In the present specification, a weight-average molecular weight (Mw), a number-average molecular weight (Mn), and a dispersity (also described as a molecular weight distribution) (Mw/Mn) of a resin are defined as values expressed in terms of polystyrene by means of gel permeation chromatography (GPC) measurement (solvent:tetrahydrofuran, flow amount (amount of a sample injected): 10 μL, columns: TSK gel Multipore HXL-M manufactured by Tosoh Corporation, column temperature: 40° C., flow rate: 1.0 mL/min, and detector: differential refractive index detector) using a GPC apparatus (HLC-8120GPC manufactured by Tosoh Corporation).

"Radiation" in the present specification means, for example, a bright line spectrum of a mercury lamp, far ultraviolet rays typified by an excimer laser, extreme ultraviolet rays (EUV), X-rays, electron beams (EB), or the like. "Light" in the present specification means radiation.

An "acid dissociation constant pKa" in the present specification refers to an acid dissociation constant pKa in an aqueous solution, and is defined, for example, in Chemical Handbook (II) (Revised 4th Edition, 1993, compiled by the Chemical Society of Japan, Maruzen Company, Ltd.). A lower value of the acid dissociation constant pKa indicates a higher acid strength. Specifically, the acid dissociation constant pKa in an aqueous solution can be actually measured by using an infinite-dilution aqueous solution and measuring the acid dissociation constant at 25° C. Alternatively, the acid dissociation constant pKa can also be determined using the following software package 1 by computation from a value based on a Hammett's substituent constant and the database of publicly known literature values. Any of the pKa values described in the present specification indicate values determined by computation using the software package.

Software Package 1: Advanced Chemistry Development (ACD/Labs) Software V 8.14 for Solaris (1994-2007 ACD/Labs).

[Method for Producing Actinic Ray-Sensitive or Radiation-Sensitive Resin Composition]

As a feature of the method for producing an actinic ray-sensitive or radiation-sensitive resin composition (hereinafter also referred to as a "resist composition") of the embodiment of the present invention, it may be mentioned that an intermediate solution including a photoacid generator and a solvent is prepared in advance, and this intermediate solution and other raw material components including a resin are mixed, as described in steps 1 and 2 which will be described later, in preparation of a high-viscosity resist composition having a viscosity of 10 mPa·s or more.

The present inventors have examined the problems of the related art, and have thus found that in a case where a resist composition is produced by mixing and stirring raw material components and a solvent, a photoacid generator which is a raw material and is generally a solid raw material remains undissolved in the solvent, which is one of the causes of particles in the resist composition.

A resist composition for forming a thick resist film usually needs to be adjusted to have a high concentration of solid contents, and thus, a viscosity thereof is also high (for example, 10 mPa·s or more). Therefore, the resist composition for forming a thick resist film inevitably has a large content of each raw material component with respect to the solvent, as compared with a resist composition for forming a thin resist film, which is adjusted to have a low concentration of solid contents. Therefore, it is considered that in a case where a resist composition is produced by mixing and stirring raw material components and a solvent, undissolved residues of a photoacid generator which is a solid raw material are easily generated. In addition, a high-viscosity resist composition has a low stirring efficiency, which can also be a cause of undissolved residues of the photoacid generator which is a solid raw material.

In contrast to the findings, in the method for producing a resist composition of the embodiment of the present invention, an intermediate solution including a photoacid generator as a solid raw material and a solvent is prepared in advance, and the intermediate solution and other raw material components including a resin are mixed, whereby a solubility of the photoacid generator which is a solid raw material in the solvent is enhanced and the generation of particles in the resist composition is suppressed.

Hereinbelow, the method for producing the resist composition of the embodiment of the present invention will be described in detail.

The method for producing a resist composition of the embodiment of the present invention is a method for producing a resist composition including a resin, a photoacid generator, and a solvent, and having a viscosity of 10 mPa·s or more, the method including the following steps 1 and 2.

Step 1: A step of preparing an intermediate solution including a photoacid generator and a solvent Step 2: A step of mixing the intermediate solution with at least a resin to prepare a resist composition having a viscosity of 10 mPa·s or more Furthermore, the production method of the embodiment of the present invention is preferably carried out in a clean room. The degree of cleanliness is preferably Class 6 or less, more preferably Class 5 or less, and still more preferably Class 4 or less in International Standard ISO 14644-1.

In the present specification, a "solid content" is intended to be all components except for solvents. Even in a case where the properties of the components are liquid, they are treated as solid contents.

[Step 1]

The step 1 is a step of preparing an intermediate solution including a photoacid generator and a solvent.

Furthermore, the details of the photoacid generator and the solvent used in the present step 1 will be described in detail later.

The intermediate solution may include components other than the photoacid generator and the solvent, but it is preferable that the intermediate solution substantially does not include a resin (in particular, a resin having a polarity that increases by the action of an acid). Here, the expression "the intermediate solution substantially does not include a resin" is intended to mean that a content of the resin is 10% by mass or less with respect to a total mass of the intermediate solution, and the content is preferably 8% by mass or less, more preferably 7% by mass or less, still more preferably 6% by mass or less, and particularly preferably 5% by mass or less. Furthermore, the lower limit value is 0% by mass.

In the intermediate solution, a content of the photoacid generator is preferably 80% to 100% by mass, more preferably 90% to 100% by mass, still more preferably 95% to 100% by mass, and particularly preferably 98% to 100% by mass with respect to the total solid content of the intermediate solution.

Above all, the intermediate solution preferably substantially does not include other components other than the photoacid generator and the solvent. Here, the expression "the intermediate solution substantially does not include other components other than the photoacid generator and the solvent" is intended to mean that a total content of other components other than the photoacid generator and the solvent is less than 1% by mass with respect to a total mass of the intermediate solution, and the total content is preferably 0.5% by mass or less, and more preferably 0.3% by mass or less with respect to the total mass of the intermediate solution. Furthermore, the lower limit value is 0% by mass. Therefore, in a case where the resist composition includes other components such as an acid diffusion control agent, a surfactant, a plasticizer, an onium carboxylate salt, and a dissolution inhibiting compound, it is preferable that these other components are mixed with the intermediate solution in the step 2.

A viscosity of the intermediate solution is not particularly limited, but is, for example, 80 mPa·s or less, and from the viewpoint that the amount of particles generated in the resist composition can be further reduced, the viscosity is preferably 50 mPa·s or less, more preferably 30 mPa·s or less, still more preferably 10 mPa·s or less, and particularly preferably 3.0 mPa·s or less. Furthermore, the lower limit value is not particularly limited, but is, for example, 1.0 mPa·s or more.

In the present specification, the viscosity of the intermediate solution and the viscosity of the resist composition formed through the step 2 which will be described later are intended to mean a viscosity at 25° C., and are measured by an E-type viscometer.

A difference in viscosities between the intermediate solution and a resist composition formed through the step 2 (a difference between the viscosity of the resist composition formed and the viscosity of the intermediate solution through the step 2) is, for example, 30 mPa·s or more, more preferably 50 mPa·s or more, and still more preferably 100 mPa·s or more from the viewpoint that the amount of particles generated in the resist composition can be further reduced. In addition, the upper limit value is, for example, 800 mPa·s or less, and from the viewpoint that the amount of particles generated in the resist composition can be further reduced, the upper limit value is more preferably 600 mPa·s or less, still more preferably 400 mPa·s or less, and particularly preferably 300 mPa·s or less.

Incidentally, a method for measuring the viscosity of the intermediate solution and the viscosity of the resist composition formed through the step 2 which will be described later is as described above.

A content of the photoacid generator in the intermediate solution is not particularly limited, but is preferably 1% by mass or more, more preferably 5% by mass or more, and still more preferably 10% by mass or more with respect to the total mass of the intermediate solution. In addition, the upper limit value is preferably 75% by mass or less, more preferably 60% by mass or less, and still more preferably 50% by mass or less.

The concentration of solid contents of the intermediate solution is not particularly limited, and is, for example, 1% to 75% by mass. The lower limit value of the concentration of solid contents of the intermediate solution is more preferably 5% by mass or more, and still more preferably 10% by mass or more. In addition, the upper limit value is more preferably 60% by mass or less, and still more preferably 50% by mass or less. Furthermore, the concentration of solid contents of the intermediate solution is a mass percentage of the mass of the component except for the solvent with respect to the total mass of the intermediate solution.

In the intermediate solution, a solubility of the photoacid generator in 100 g of the solvent at 25° C. is, for example, preferably 0.1 g or more, and from the viewpoint that the amount of particles generated in the resist composition can be further reduced, the solubility is more preferably 0.5 g or more, and still more preferably more than 3.0 g. Furthermore, the upper limit value of the solubility of the acid generator in 100 g of the solvent at 25° C. is not particularly limited, but is, for example, 10 g or less.

The photoacid generator preferably includes a compound having a phenacylsulfonium salt structure from the viewpoint that the resolution is more excellent. Among the compounds having a phenacylsulfonium salt structure, a compound represented by General Formula (ZI-5) is preferable from the viewpoint that the amount of particles generated in the resist composition can be further reduced, as described later.

In the intermediate solution, the solvent is not particularly limited, but from the viewpoint of the in-plane uniformity of a film thickness at the time of applying the resist composition, the solvent is preferably an organic solvent having a boiling point (which means a boiling point at 1 atm) of 160° C. or lower. The type of the solvent is not particularly limited, but is preferably selected from the solvents which occupy 20% by mass or more with respect to a total mass of the solvents, among the solvents included in the resist composition formed through the step 2. From the viewpoint that the amount of particles generated in the resist composition can be further reduced, as the solvent, one or more solvents selected from the group consisting of propylene glycol monomethyl ether acetate (PGMEA), propylene glycol monomethyl ether (PGME), ethyl lactate, cyclohexanone, and cyclopentanone are preferable.

(Method for Preparing Intermediate Solution)

A method for preparing the intermediate solution is not particularly limited, and is preferably a method in which a photoacid generator and a solvent are mixed and stirred.

A temperature of the intermediate solution at the time of stirring and mixing is not particularly limited, but is preferably 15° C. to 32° C., and more preferably 20° C. to 24° C.

In addition, the temperature of the intermediate solution during stirring and mixing is preferably kept constant, and is preferably within ±10° C., more preferably within ±5° C., and still more preferably within ±1° C. from a set temperature.

A stirring and mixing time is not particularly limited, but is preferably 1 to 48 hours, and more preferably 15 to 24 hours from the viewpoint that the amount of particles generated in the resist composition can be further reduced.

During stirring and mixing, ultrasonic waves may be applied to the intermediate solution.

The intermediate solution may be a suspension in which a photoacid generator is dispersed in a solvent or may be a solution in a state where a photoacid generator is dissolved in a solvent, but is preferably the solution in a state where a photoacid generator is dissolved in a solvent from the viewpoint that the amount of particles generated in the resist composition can be further reduced.

[Step 2]

The step 2 is a step of mixing the intermediate solution prepared in the step 1 with at least a resin to prepare a resist composition.

The step 2 preferably includes the following step 2A and the following step 2B.

Step 2A: A step of mixing the intermediate solution prepared in the step 1 with at least a resin Step 2B: A step of stirring and mixing the mixed solution obtained in the step 2A Furthermore, the details of the resin used in the present step 2 will be described in detail later.

In the present step 2, the components other than the intermediate solution and the resin may be mixed. Examples of such other components include an acid diffusion control agent, a surfactant, a plasticizer, an onium carboxylate salt, and a dissolution inhibiting compound. Details of such other components will also be described later.

The step 2 is preferably carried out using a stirring tank. FIG. 1 shows a schematic view of an embodiment of a device provided with a stirring tank which can be used in the step 2.

A device 100 has a stirring tank 10, a stirring shaft 12 rotatably attached in the stirring tank 10, a stirring blade 14 attached to the stirring shaft 12, a circulation pipe 16 having one end connected to a bottom part of the stirring tank 10 and another end connected to an upper part of the stirring tank 10, a filter 18 arranged in the middle of the circulation pipe 16, a discharge pipe 20 connected to the circulation pipe 16, and a discharge nozzle 22 arranged on an end part of the discharge pipe 20.

It is preferable that a liquid contact portion (a part in contact with the liquid) in the device is lined or coated with a fluorine resin and the like.

In addition, it is preferable that the device 100 is washed with a solvent in advance before carrying out the step 2. Examples of the solvent and the washing method used include known methods, and examples thereof include the solvent and the washing method of JP2015-197646A.

The stirring tank 10 is not particularly limited as long as it can accommodate the resin and the intermediate solution, and examples thereof include known stirring tanks.

A shape of the bottom part of the stirring tank 10 is not particularly limited, examples thereof include a standard flanged dished head shape, an ellipsoidal dished head shape, a flanged only head shape, and a conical head shape, and the standard flanged dished head and the ellipsoidal dished head shape are preferable.

Baffle plates may be installed in the stirring tank 10 in order to improve the stirring efficiency.

The number of the baffle plates is not particularly limited, and is preferably 2 to 8.

A width of the baffle plate is not particularly limited, and is preferably ⅛ to ½ of the diameter of the stirring tank.

A length of the baffle plate in the height direction of the stirring tank is not particularly limited, but is preferably ½ or more, more preferably ⅔ or more, and still more preferably ¾ or more of the height from the bottom part of the stirring tank to the liquid level of the component to be charged.

It is preferable that a drive source (for example, a motor) (not shown) is attached to the stirring shaft 12. In a case where the stirring shaft 12 is rotated by the drive source, the stirring blade 14 is rotated and the respective components charged into the stirring tank 10 are stirred.

The shape of the stirring blade 14 is not particularly limited, and examples thereof include a paddle blade, a propeller blade, and a turbine blade.

Furthermore, the stirring tank 10 may have a material charging port for charging various materials into the stirring tank.

Moreover, the stirring tank 10 may have a gas introduction port for introducing a gas into the inside of the tank.

In addition, the stirring tank 10 may have a gas discharge port for discharging the gas inside the stirring tank to the outside of the stirring tank.

Procedure for charging the resin and the intermediate solution into the stirring tank 10 is not particularly limited.

Examples thereof include a method of charging the components from a material charging port not shown of the stirring tank 10. In a case of charging the components, the components may be charged sequentially or collectively. Furthermore, in a case of charging one component, the component may be charged a plurality of times.

In addition, in a case where the respective components are sequentially charged into the stirring tank 10, the charging order is not particularly limited. For example, in a case where five components of a resin, an intermediate solution, a solvent, an acid diffusion control agent, and an additive are charged into the stirring tank 10, there may be 120 charging methods as shown in Tables 1 and 2 below. Incidentally, the additive is intended to be a component other than the resin, the intermediate solution, the solvent, and the acid diffusion control agent.

Moreover, the order (1 to 5) in which the five components are charged into the stirring tank 10 is shown in Tables 1 and 2.

TABLE 1

| Example | Charging order 1 | 2 | 3 | 4 | 5 |
|---|---|---|---|---|---|
| 1 | Resin | Solvent | Intermediate solution | Acid diffusion control agent | Additive |
| 2 | Resin | Solvent | Intermediate solution | Additive | Acid diffusion control agent |
| 3 | Resin | Solvent | Acid diffusion control agent | Intermediate solution | Additive |
| 4 | Resin | Solvent | Acid diffusion control agent | Additive | Intermediate solution |
| 5 | Resin | Solvent | Additive | Intermediate solution | Acid diffusion control agent |
| 6 | Resin | Solvent | Additive | Acid diffusion control agent | Intermediate solution |
| 7 | Resin | Intermediate solution | Solvent | Acid diffusion control agent | Additive |
| 8 | Resin | Intermediate solution | Solvent | Additive | Acid diffusion control agent |
| 9 | Resin | Intermediate solution | Acid diffusion control agent | Solvent | Additive |
| 10 | Resin | Intermediate solution | Acid diffusion control agent | Additive | Solvent |
| 11 | Resin | Intermediate solution | Additive | Solvent | Acid diffusion control agent |
| 12 | Resin | Intermediate solution | Additive | Acid diffusion control agent | Solvent |
| 13 | Resin | Acid diffusion control agent | Solvent | Intermediate solution | Additive |
| 14 | Resin | Acid diffusion control agent | Solvent | Additive | Intermediate solution |
| 15 | Resin | Acid diffusion control agent | Intermediate solution | Solvent | Additive |
| 16 | Resin | Acid diffusion control agent | Intermediate solution | Additive | Solvent |
| 17 | Resin | Acid diffusion control agent | Additive | Solvent | Intermediate solution |
| 18 | Resin | Acid diffusion control agent | Additive | Intermediate solution | Solvent |
| 19 | Resin | Additive | Solvent | Intermediate solution | Acid diffusion control agent |
| 20 | Resin | Additive | Solvent | Acid diffusion control agent | Intermediate solution |
| 21 | Resin | Additive | Intermediate solution | Solvent | Acid diffusion control agent |
| 22 | Resin | Additive | Intermediate solution | Acid diffusion control agent | Solvent |
| 23 | Resin | Additive | Acid diffusion control agent | Solvent | Intermediate solution |
| 24 | Resin | Additive | Acid diffusion control agent | Intermediate solution | Solvent |
| 25 | Solvent | Resin | Intermediate solution | Acid diffusion control agent | Additive |
| 26 | Solvent | Resin | Intermediate solution | Additive | Acid diffusion control agent |
| 27 | Solvent | Resin | Acid diffusion control agent | Intermediate solution | Additive |
| 28 | Solvent | Resin | Acid diffusion control agent | Additive | Intermediate solution |
| 29 | Solvent | Resin | Additive | Intermediate solution | Acid diffusion control agent |
| 30 | Solvent | Resin | Additive | Acid diffusion control agent | Intermediate solution |
| 31 | Solvent | Intermediate solution | Resin | Acid diffusion control agent | Additive |
| 32 | Solvent | Intermediate solution | Resin | Additive | Acid diffusion control agent |
| 33 | Solvent | Intermediate solution | Acid diffusion control agent | Resin | Additive |
| 34 | Solvent | Intermediate solution | Acid diffusion control agent | Additive | Resin |
| 35 | Solvent | Intermediate solution | Additive | Resin | Acid diffusion control agent |
| 36 | Solvent | Intermediate solution | Additive | Acid diffusion control agent | Resin |
| 37 | Solvent | Acid diffusion control agent | Resin | Intermediate solution | Additive |
| 38 | Solvent | Acid diffusion control agent | Resin | Additive | Intermediate solution |

TABLE 1-continued

| Example | Charging order 1 | 2 | 3 | 4 | 5 |
|---|---|---|---|---|---|
| 39 | Solvent | Acid diffusion control agent | Intermediate solution | Resin | Additive |
| 40 | Solvent | Acid diffusion control agent | Intermediate solution | Additive | Resin |
| 41 | Solvent | Acid diffusion control agent | Additive | Resin | Intermediate solution |
| 42 | Solvent | Acid diffusion control agent | Additive | Intermediate solution | Resin |
| 43 | Solvent | Additive | Resin | Intermediate solution | Acid diffusion control agent |
| 44 | Solvent | Additive | Resin | Acid diffusion control agent | Intermediate solution |
| 45 | Solvent | Additive | Intermediate solution | Resin | Acid diffusion control agent |
| 46 | Solvent | Additive | Intermediate solution | Acid diffusion control agent | Resin |
| 47 | Solvent | Additive | Acid diffusioncontrol agent | Resin | Intermediate solution |
| 48 | Solvent | Additive | Acid diffusion control agent | Intermediate solution | Resin |
| 49 | Intermediate solution | Resin | Solvent | Acid diffusion control agent | Additive |
| 50 | Intermediate solution | Resin | Solvent | Additive | Acid diffusion control agent |
| 51 | Intermediate solution | Resin | Acid diffusion control agent | Solvent | Additive |
| 52 | Intermediate solution | Resin | Acid diffusion control agent | Additive | Solvent |
| 53 | Intermediate solution | Resin | Additive | Solvent | Acid diffusion control agent |
| 54 | Intermediate solution | Resin | Additive | Acid diffusion control agent | Solvent |
| 55 | Intermediate solution | Solvent | Resin | Acid diffusion control agent | Additive |
| 56 | Intermediate solution | Solvent | Resin | Additive | Acid diffusion control agent |
| 57 | Intermediate solution | Solvent | Acid diffusion control agent | Resin | Additive |
| 58 | Intermediate solution | Solvent | Acid diffusion control agent | Additive | Resin |
| 59 | Intermediate solution | Solvent | Additive | Resin | Acid diffusion control agent |
| 60 | Intermediate solution | Solvent | Additive | Acid diffusion control agent | Resin |

TABLE 2

| Example | Charging order 1 | 2 | 3 | 4 | 5 |
|---|---|---|---|---|---|
| 61 | Intermediate solution | Acid diffusion control agent | Resin | Solvent | Additive |
| 62 | Intermediate solution | Acid diffusion control agent | Resin | Additive | Solvent |
| 63 | Intermediate solution | Acid diffusion control agent | Solvent | Resin | Additive |
| 64 | Intermediate solution | Acid diffusion control agent | Solvent | Additive | Resin |
| 65 | Intermediate solution | Acid diffusion control agent | Additive | Resin | Solvent |
| 66 | Intermediate solution | Acid diffusion control agent | Additive | Solvent | Resin |
| 67 | Intermediate solution | Additive | Resin | Solvent | Acid diffusion control agent |
| 68 | Intermediate solution | Additive | Resin | Acid diffusion control agent | Solvent |
| 69 | Intermediate solution | Additive | Solvent | Resin | Acid diffusion control agent |
| 70 | Intermediate solution | Additive | Solvent | Acid diffusion control agent | Resin |
| 71 | Intermediate solution | Additive | Acid diffusion control agent | Resin | Solvent |

TABLE 2-continued

| Example | Charging order 1 | 2 | 3 | 4 | 5 |
|---|---|---|---|---|---|
| 72 | Intermediate solution | Additive | Acid diffusion control agent | Solvent | Resin |
| 73 | Acid diffusion control agent | Resin | Solvent | Intermediate solution | Additive |
| 74 | Acid diffusion control agent | Resin | Solvent | Additive | Intermediate solution |
| 75 | Acid diffusion control agent | Resin | Intermediate solution | Solvent | Additive |
| 76 | Acid diffusion control agent | Resin | Intermediate solution | Additive | Solvent |
| 77 | Acid diffusion control agent | Resin | Additive | Solvent | Intermediate solution |
| 78 | Acid diffusion control agent | Resin | Additive | Intermediate solution | Solvent |
| 79 | Acid diffusion control agent | Solvent | Resin | Intermediate solution | Additive |
| 80 | Acid diffusion control agent | Solvent | Resin | Additive | Intermediate solution |
| 81 | Acid diffusion control agent | Solvent | Intermediate solution | Resin | Additive |
| 82 | Acid diffusion control agent | Solvent | Intermediate solution | Additive | Resin |
| 83 | Acid diffusion control agent | Solvent | Additive | Resin | Intermediate solution |
| 84 | Acid diffusion control agent | Solvent | Additive | Intermediate solution | Resin |
| 85 | Acid diffusion control agent | Intermediate solution | Resin | Solvent | Additive |
| 86 | Acid diffusion control agent | Intermediate solution | Resin | Additive | Solvent |
| 87 | Acid diffusion control agent | Intermediate solution | Solvent | Resin | Additive |
| 88 | Acid diffusion control agent | Intermediate solution | Solvent | Additive | Resin |
| 89 | Acid diffusion control agent | Intermediate solution | Additive | Resin | Solvent |
| 90 | Acid diffusion control agent | Intermediate solution | Additive | Solvent | Resin |
| 91 | Acid diffusion control agent | Additive | Resin | Solvent | Intermediate solution |
| 92 | Acid diffusion control agent | Additive | Resin | Intermediate solution | Solvent |
| 93 | Acid diffusion control agent | Additive | Solvent | Resin | Intermediate solution |
| 94 | Acid diffusion control agent | Additive | Solvent | Intermediate solution | Resin |
| 95 | Acid diffusion control agent | Additive | Intermediate solution | Resin | Solvent |
| 96 | Acid diffusion control agent | Additive | Intermediate solution | Solvent | Resin |
| 97 | Additive | Resin | Solvent | Intermediate solution | Acid diffusion control agent |
| 98 | Additive | Resin | Solvent | Acid diffusion control agent | Intermediate solution |
| 99 | Additive | Resin | Intermediate solution | Solvent | Acid diffusion control agent |
| 100 | Additive | Resin | Intermediate solution | Acid diffusion control agent | Solvent |
| 101 | Additive | Resin | Acid diffusion control agent | Solvent | Intermediate solution |
| 102 | Additive | Resin | Acid diffusion control agent | Intermediate solution | Solvent |
| 103 | Additive | Solvent | Resin | Intermediate solution | Acid diffusion control agent |
| 104 | Additive | Solvent | Resin | Acid diffusion control agent | Intermediate solution |
| 105 | Additive | Solvent | Intermediate solution | Resin | Acid diffusion control agent |
| 106 | Additive | Solvent | Intermediate solution | Acid diffusion control agent | Resin |
| 107 | Additive | Solvent | Acid diffusion control agent | Resin | Intermediate solution |
| 108 | Additive | Solvent | Acid diffusion control agent | Intermediate solution | Resin |
| 109 | Additive | Intermediate solution | Resin | Solvent | Acid diffusion control agent |

TABLE 2-continued

| Example | Charging order 1 | 2 | 3 | 4 | 5 |
|---|---|---|---|---|---|
| 110 | Additive | Intermediate solution | Resin | Acid diffusion control agent | Solvent |
| 111 | Additive | Intermediate solution | Solvent | Resin | Acid diffusion control agent |
| 112 | Additive | Intermediate solution | Solvent | Acid diffusion control agent | Resin |
| 113 | Additive | Intermediate solution | Acid diffusion control agent | Resin | Solvent |
| 114 | Additive | Intermediate solution | Acid diffusion control agent | Solvent | Resin |
| 115 | Additive | Acid diffusion control agent | Resin | Solvent | Intermediate solution |
| 116 | Additive | Acid diffusion control agent | Resin | Intermediate solution | Solvent |
| 117 | Additive | Acid diffusion control agent | Solvent | Resin | Intermediate solution |
| 118 | Additive | Acid diffusion control agent | Solvent | Intermediate solution | Resin |
| 119 | Additive | Acid diffusion control agent | Intermediate solution | Resin | Solvent |
| 120 | Additive | Acid diffusion control agent | Intermediate solution | Solvent | Resin |

In addition, in a case where a component other than the solvent and the intermediate solution is charged into the stirring tank, the component may be charged into the stirring tank 10 as a solution in which the component is dissolved in the solvent. At that time, in order to remove an insoluble matter in the solution, the solution may be filtered with a filter and then charged into the stirring tank 10.

In addition, in a case where the solvent is charged into the stirring tank 10, the solvent may be filtered with a filter and then charged into the stirring tank 10.

Furthermore, in a case where various components are charged into the stirring tank 10, a liquid feeding pump may be used.

A concentration of the component in the solution in which the component is dissolved is not particularly limited, but is preferably 10% to 50% by mass with respect to a total mass of the solution.

Furthermore, in a case where the intermediate solution is charged into the stirring tank 10, the intermediate solution may be filtered with a filter and then charged into the stirring tank 10.

A kind of a filter used for the filter filtration is not particularly limited, and a known filter is used.

A pore diameter (pore size) of the filter is preferably 0.20 μm or less, more preferably 0.10 μm or less, and still more preferably 0.05 μm or less.

As a material of the filter, a fluorine resin such as polytetrafluoroethylene, a polyolefin resin such as polypropylene and polyethylene, and a polyamide resin such as nylon 6 and nylon 66 are preferable.

As the filter, a filter which has been washed with an organic solvent in advance may be used.

In the filtration using a filter, a plurality of filters connected in series or in parallel may be used. In a case where the plurality of filters are used, a combination of filters having different pore diameters and/or materials may be used. In addition, in the filtration with a filter, circulation-filtration may be carried out. As a method of circulation-filtration, for example, the method disclosed in JP2002-062667A is preferable.

As the filter, a filter having a reduced amount of elutes as disclosed in JP2016-201426A is preferable.

Moreover, after the filter filtration, impurities may be further removed by an adsorbing material.

Usually, in a case where a resin and an intermediate solution are charged into a stirring tank, it is preferable that the components are charged such that a space is generated in the stirring tank. More specifically, as shown in FIG. 1, it is preferable that the respective components are charged into the stirring tank such that a space S (void S) not occupied by a mixture M including at least the resin and the intermediate solution is generated in the stirring tank 10.

An occupancy of the mixture including at least the resin and the intermediate solution in the stirring tank is not particularly limited, but is preferably 50% to 95% by volume, and more preferably 80% to 90% by volume.

Furthermore, the occupancy of the mixture can be determined by Expression (1).

$$\text{Occupancy}=\{(\text{Volume of mixture in stirring tank}/\text{Volume of container in stirring tank})\}\times 100 \quad \text{Expression (1):}$$

In addition, a void ratio (proportion occupied by the space (void)) in the stirring tank is preferably 5% to 50% by volume, and more preferably 10% to 20% by volume.

The void ratio can be determined by Expression (2).

$$\text{Void ratio}=\{1-(\text{Volume of mixture in stirring tank}/\text{Volume of container in stirring tank})\}\times 100 \quad \text{Expression (2):}$$

After charging the mixture including at least the resin and the intermediate solution into the stirring tank, stirring and mixing in the step 2B are carried out. The step 2B is preferably carried out in a state where the space S shown in FIG. 1 is filled with a gas (hereinafter also referred to as a "specific gas") having a concentration of an inert gas of 90% by volume or more (preferably 90% to 100% by volume) (filled state).

Examples of the inert gas include nitrogen, and noble gases such as helium and argon. Examples of a gas other than the inert gas in the specific gas include oxygen and moisture.

In the step 2B, it is sufficient that various components can be stirred and mixed in the presence of the specific gas, and a time (timing) for substituting the gas in the stirring tank with the specific gas is not particularly limited.

For example, a method in which a step 2C of substituting the gas in the stirring tank with a specific gas is carried out before the above-mentioned step 2A may be mentioned. That is, a method in which the gas in the stirring tank is substituted with the specific gas before charging the resin and the intermediate solution into the stirring tank may be mentioned. Examples of the substituting method include a method of supplying (introducing) an inert gas into the stirring tank. In a case where the step 2C is carried out, it is preferable that the step 2A and the step 2B are carried out while introducing the specific gas into the stirring tank in order to maintain the state where the gas in the stirring tank is the specific gas. That is, it is preferable to start the introduction of the specific gas into the stirring tank before the step 2A, and then carry out the step 2A and the step 2B in the presence of the specific gas (in a state where the space of the stirring tank is filled with the specific gas).

In addition, a method in which the gas in the stirring tank is substituted with a specific gas in the above-mentioned step 2A may be mentioned. That is, a method in which the gas in the stirring tank is substituted with the specific gas at the same time upon charging the resin and the intermediate solution into the stirring tank may be mentioned. Examples of the substituting method include a method of supplying (introducing) an inert gas into the stirring tank. In a case where the gas in the stirring tank is substituted with a specific gas in the step 2A is carried out, it is preferable to carry out the step 2B while introducing the specific gas into the stirring tank in order to maintain the state in which the gas in the stirring tank is the specific gas. That is, it is preferable to start the introduction of the specific gas into the stirring tank in the step 2A, and then carry out the step 2B in the presence of the specific gas (in the state where the space of the stirring tank is filled with the specific gas).

In addition, a method in which a step 2D of substituting the gas in the stirring tank with a specific gas is carried out between the above-mentioned step 2A and 2B may be mentioned. That is, a method in which the gas in the stirring tank is substituted with the specific gas after charging the resin and the intermediate solution into the stirring tank may be mentioned. Examples of the substituting method include a method of supplying (introducing) an inert gas into the stirring tank. In a case where the step 2D is carried out, it is preferable to carry out the step 2B while introducing the specific gas into the stirring tank in order to maintain the state in which the gas in the stirring tank is the specific gas. That is, it is preferable to start the introduction of the specific gas into the stirring tank after the step 2A, and then carry out the step 2B in the presence of the specific gas (in the state where the space of the stirring tank is filled with the specific gas).

Among those, it is preferable to carry out the step 2C.

Furthermore, in a case where the inert gas is supplied (introduced) into the stirring tank, it may be supplied through a gas filter for the inert gas or compressed air.

In the step 2B, the atmospheric pressure inside the stirring tank is preferably adjusted to be higher than the atmospheric pressure outside the stirring tank. By maintaining this state, it is possible to suppress the gas including moisture and oxygen outside the stirring tank from being incorporated into the stirring tank.

Examples of the method of maintaining the state include a method of continuously introducing the specific gas into the stirring tank.

In addition, in the step 2B, a difference between the atmospheric pressure inside the stirring tank and the atmospheric pressure outside the stirring tank is preferably adjusted to be 2.0 kPa or less. In other words, the difference between the atmospheric pressure of the specific gas in the space inside the stirring tank and the atmospheric pressure outside the stirring tank is preferably adjusted to be 2.0 kPa or less. By maintaining this state, it is possible to suppress the dissolution of the specific gas into the mixture in the stirring tank, and it is possible to further suppress the generation of defects in a pattern thus formed. The difference is preferably 0.8 kPa or less. The lower limit is not particularly limited, but is preferably 0.1 kPa or more.

Furthermore, a method for measuring the atmospheric pressure inside the stirring tank and the atmospheric pressure outside the stirring tank is not particularly limited, and is carried out using a commercially available barometer.

A method for performing the stirring and mixing of the step 2B is not particularly limited, but is preferably carried out with the above-mentioned stirring blade. Furthermore, in a case of performing the stirring and mixing, it is preferable to perform the stirring in consideration of a shape and a size of the stirring blade, an installation location, a stirring rotation speed, and the like such that the liquid is sufficiently stirred.

A temperature of the mixture including the resin and the intermediate solution during stirring and mixing is not particularly limited, but is preferably 15° C. to 32° C., and more preferably 20° C. to 24° C.

In addition, in a case of performing the stirring and mixing, the temperature of the mixture is preferably kept constant, and is preferably within ±10° C., more preferably within ±5° C., and still more preferably within ±1° C. from a set temperature.

A stirring and mixing time is not particularly limited, but is preferably 1 to 48 hours, and more preferably 10 to 24 hours from the viewpoint of a balance of the uniformity of the obtained resist composition and the productivity.

A rotation speed of the stirring blade during the stirring and mixing is not particularly limited, but is preferably 20 to 500 rpm, more preferably 40 to 350 rpm, and still more preferably 50 to 300 rpm.

Furthermore, in a case of stopping the stirring and mixing, it is preferable to confirm that various components are dissolved in the solvent.

During the stirring and mixing, ultrasonic waves may be applied to the mixture.

A content of the moisture in the resist composition is not particularly limited, but is preferably 0.10% by mass or less, more preferably 0.06% by mass or less, and still more preferably 0.04% by mass or less. A lower limit of the moisture content is not particularly limited, but is often 0.01% by mass or more.

Examples of a method for measuring the moisture content in the resist composition include a method using a Karl Fischer moisture measuring device.

An oxygen content in the resist composition is not particularly limited, but is preferably 0.030 μg/μL or less, and more preferably 0.027 μg/μL or less. A lower limit of the oxygen content is not particularly limited, but is often 0.001 μg/μL or more.

A dissolved gas content in the resist composition is not particularly limited, but is preferably 0.210 μg/μL or less, and more preferably 0.190 μg/μL or less. A lower limit of the dissolved gas content is not particularly limited, but is often 0.001 μg/μL or more.

Examples of a method for measuring the dissolved gas content in the resist composition include a method using gas chromatography (GC390 manufactured by GL Sciences Inc.) having a thermal conductivity detector (TCD).

Moreover, in the present specification, the dissolved gas content corresponds to a sum of the nitrogen content and the oxygen content.

After carrying out the step 2B, the resist composition thus produced may be subjected to a filtration treatment.

For example, a method in which the resist composition produced in the stirring tank 10 is fed to the circulation pipe 16 and filtered with the filter 18 in the device 100 shown in FIG. 1 may be mentioned. Furthermore, in a case where the resist composition is fed from the stirring tank 10 to the circulation pipe 16, it is preferable to open a valve (not shown) to feed the resist composition to the circulation pipe 16.

The circulation-filtration may be carried out continuously a plurality of times. That is, the resist composition may be continuously fed to the circulation pipe and passed through the filter 18 a plurality of times.

A method for feeding the resist composition from the stirring tank 10 to the circulation pipe 16 is not particularly limited, and examples thereof include a method of feeding a liquid using gravity, a method of applying a pressure from a liquid level side of the resist composition, a method of setting a pressure on the circulation pipe 16 side to a negative pressure, and a method obtained by combination of two or more of these methods.

In a case of the method of applying a pressure from the liquid level side of the resist composition, examples of the method include a method of utilizing a flow pressure generated by feeding a liquid and a method of pressurizing a gas.

The flow pressure is preferably generated by, for example, a pump (a liquid feeding pump, a circulation pump, and the like), or the like. Examples of the pump include uses of a rotary pump, a diaphragm pump, a metering pump, a chemical pump, a plunger pump, a bellows pump, a gear pump, a vacuum pump, an air pump, and a liquid pump, as well as commercially available pumps as appropriate. A position where the pump is arranged is not particularly limited.

The gas used for pressurization is preferably a gas which is inert or non-reactive with respect to the resist composition, and specific examples thereof include nitrogen and noble gases such as helium and argon. Incidentally, it is preferable that the circulation pipe 16 side is not decompressed but has an atmospheric pressure.

As a method of making the circulation pipe 16 side have a negative pressure, decompression by a pump is preferable, and decompression to vacuum is more preferable.

Examples of the filter 18 include the filter used in the filter filtration described in the step 2A.

A differential pressure (a pressure difference between the upstream side and the downstream side) applied to the filter 18 is preferably 200 kPa or less, and more preferably 100 kPa or less.

In addition, in a case of performing the filtration with the filter 18, it is preferable that a change in the differential pressure during the filtration is small. The differential pressure before and after the filtration for a period from a point in time that the passage of the liquid through a filter is started to a point in time that 90% by mass of the solution to be filtered is finished is maintained to be preferably within ±50 kPa, and more preferably within ±20 kPa of the differential pressure before and after the filtration at the point in time that the passage of the liquid is started.

In a case of performing the filtration with the filter 18, a linear velocity is preferably in the range of 3 to 150 $L/(hr \cdot m^2)$, more preferably 5 to 120 $L/(hr \cdot m^2)$, and still more preferably 10 to 100 $L/(hr \cdot m^2)$.

Moreover, in the device 100 shown in FIG. 1, a buffer tank in which the filtered resist composition is stored may be arranged on the downstream side of the filter 18.

As shown in FIG. 1, the resist composition produced in the stirring tank 10 may be fed to the discharge pipe 20, discharged from the discharge nozzle 22 arranged at the end part of the discharge pipe 20, and accommodated in a predetermined container.

In a case where the resist composition is filled into the container, the filling rate is preferably 0.3 to 3 L/min, more preferably 0.4 to 2.0 L/min, and still more preferably 0.5 to 1.5 L/min, with a capacity of the container being, for example, 0.75 L or more and less than 5 L.

A plurality of discharge nozzles may be arranged in parallel and filling may be performed at the same time in order to improve a filling efficiency.

Examples of the container include a bloom-treated glass container and a container in which the liquid contact portion is treated to be a fluorine resin.

In a case where the resist composition is accommodated in the container, a space in the container (a region in the container not occupied by the resist composition) may be substituted with a predetermined gas. The gas is preferably a gas which is inert or non-reactive with respect to the resist composition, and specific examples thereof include nitrogen and noble gases such as helium and argon.

Furthermore, before the resist composition is accommodated in the container, a degassing treatment for removing the dissolved gas in the resist composition may be carried out. Examples of the degassing method include an ultrasonic treatment and a defoaming treatment.

A viscosity of the resist composition obtained through the step 2 is 10 mPa·s or more, preferably 100 mPa·s or more, more preferably 200 mPa·s or more, still more preferably 250 mPa·s or more, and particularly preferably 300 mPa·s or more. The upper limit of the viscosity is, for example, 1,000 mPa·s or less, preferably 800 mPa·s or less, more preferably 700 mPa·s or less, particularly preferably 500 mPa·s or less, and most preferably 400 mPa·s or less. Furthermore, a method for measuring the viscosity is as described above.

The concentration of solid contents of the resist composition obtained through the step 2 is not particularly limited, and is, for example, 15% to 70% by mass. The lower limit value of the concentration of solid contents of the resist composition is more preferably 20% by mass or more, still more preferably 25% by mass or more, and particularly preferably 30% by mass or more. In addition, the upper limit value of the concentration of solid contents is more preferably 60% by mass or less, and still more preferably 55% by mass or less, and in order not to widen the viscosity difference between the viscosity of the resist composition and the intermediate solution too much, the upper limit value is particularly preferably 50% by mass or less. Furthermore, the concentration of solid contents of the resist composition is a mass percentage of the mass of the component excluding the solvent with respect to the total mass of the resist composition.

[Actinic Ray-Sensitive or Radiation-Sensitive Resin Composition]

Hereinafter, suitable aspects of the resist composition (hereinafter also simply referred to as a "resist composition") formed by the method for producing a resist composition of the embodiment of the present invention will be described.

The resist composition includes a resin, a photoacid generator, and a solvent, and has a viscosity of 10 mPa·s or more.

Suitable aspects of the viscosity and the concentration of solid contents of the resist composition are as described as the viscosity and the concentration of solid contents of the resist composition obtained in the step 2.

Hereinbelow, various components which can be included in the resist composition will be described.

«Resin»

The resist composition includes a resin.

As the resin, a resin having a polarity that increases by the action of an acid (hereinafter also simply described as a "resin (A)") is preferable, and a resin having a repeating unit (A-a) having an acid-decomposable group (hereinafter simply a "repeating unit (A-a)") is more preferable.

<Repeating Unit Having Acid-Decomposable Group>

The acid-decomposable group refers to a group that decomposes by the action of an acid to produce a polar group. The acid-decomposable group preferably has a structure in which the polar group is protected by a leaving group that leaves by the action of an acid. That is, the resin (A) has a repeating unit (A-a) having a group that decomposes by the action of an acid to produce a polar group. A resin having this repeating unit (A-a) has an increased polarity by the action of an acid, and thus has an increased solubility in an alkali developer, and a decreased solubility in an organic solvent.

As the polar group, an alkali-soluble group is preferable, and examples thereof include an acidic group such as a carboxyl group, a phenolic hydroxyl group, a fluorinated alcohol group, a sulfonic acid group, a sulfonamide group, a sulfonylimide group, an (alkylsulfonyl)(alkylcarbonyl) methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, and an alcoholic hydroxyl group.

Among those, as the polar group, the carboxyl group, the phenolic hydroxyl group, the fluorinated alcohol group (preferably a hexafluoroisopropanol group), or the sulfonic acid group is preferable.

Examples of the leaving group that leaves by the action of an acid include groups represented by Formulae (Y1) to (Y4).

$-C(Rx_1)(Rx_2)(Rx_3)$ Formula (Y1):

$-C(=O)OC(Rx_1)(Rx_2)(Rx_3)$ Formula (Y2):

$-C(R_{36})(R_{37})(OR_{38})$ Formula (Y3):

$-C(Rn)(H)(Ar)$ Formula (Y4):

In Formula (Y1) and Formula (Y2), $Rx_1$ to $Rx_3$ each independently represent an (linear or branched) alkyl group or a (monocyclic or polycyclic) cycloalkyl group. Furthermore, in a case where all of $Rx_1$ to $Rx_3$ are (linear or branched) alkyl groups, it is preferable that at least two of $Rx_1$, $Rx_2$, or $Rx_3$ are methyl groups.

Above all, it is preferable that $Rx_1$ to $Rx_3$ each independently represent a linear or branched alkyl group, and it is more preferable that $Rx_1$ to $Rx_3$ each independently represent the linear alkyl group.

Two of $Rx_1$ to $Rx_3$ may be bonded to each other to form a monocycle or a polycycle.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group is preferable, and a monocyclic cycloalkyl group having 5 or 6 carbon atoms is more preferable.

In the cycloalkyl group formed by the bonding of two of $Rx_1$ to $Rx_3$, for example, one of the methylene groups constituting the ring may be substituted with a heteroatom such as an oxygen atom, or a group having a heteroatom, such as a carbonyl group.

With regard to the group represented by Formula (Y1) or Formula (Y2), for example, an aspect in which $Rx_1$ is a methyl group or an ethyl group, and $Rx_2$ and $Rx_3$ are bonded to each other to form a cycloalkyl group is preferable.

In Formula (Y3), $R_{36}$ to $R_{38}$ each independently represent a hydrogen atom or a monovalent organic group. $R_{37}$ and $R_{38}$ may be bonded to each other to form a ring. Examples of the monovalent organic group include an alkyl group, a cycloalkyl group, an aryl group, an aralkyl group, and an alkenyl group. It is also preferable that $R_{36}$ is the hydrogen atom.

As Formula (Y3), a group represented by Formula (Y3-1) is preferable.

(Y3-1)

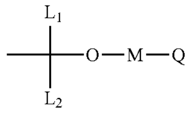

Here, $L_1$ and $L_2$ each independently represent a hydrogen atom, an alkyl group, a cycloalkyl group, an aryl group, or a group formed by combination thereof (for example, a group formed by combination of an alkyl group and an aryl group).

M represents a single bond or a divalent linking group.

Q represents an alkyl group which may have a heteroatom, a cycloalkyl group which may have a heteroatom, an aryl group which may have a heteroatom, an amino group, an ammonium group, a mercapto group, a cyano group, an aldehyde group, or a group formed by combination thereof (for example, a group formed by combination of an alkyl group and a cycloalkyl group).

In the alkyl group and the cycloalkyl group, for example, one of the methylene groups may be substituted with a heteroatom such as an oxygen atom or a group having a heteroatom, such as a carbonyl group.

In addition, it is preferable that one of $L_1$ or $L_2$ is a hydrogen atom, and the other is an alkyl group, a cycloalkyl group, an aryl group, or a group formed by combination of an alkylene group and an aryl group.

At least two of Q, M, or $L_1$ may be bonded to each other to form a ring (preferably a 5- or 6-membered ring).

From the viewpoint of pattern miniaturization, $L_2$ is preferably a secondary or tertiary alkyl group, and more preferably the tertiary alkyl group. Examples of the secondary alkyl group include an isopropyl group, a cyclohexyl group, and a norbornyl group, and examples of the tertiary alkyl group include a tert-butyl group and an adamantane ring group. In these aspects, since the glass transition temperature (Tg) and the activation energy are increased, it is possible to suppress fogging in addition to ensuring film hardness.

In Formula (Y4), Ar represents an aromatic ring group. Rn represents an alkyl group, a cycloalkyl group, or an aryl group. Rn and Ar may be bonded to each other to form a non-aromatic ring. Ar is more preferably the aryl group.

As the repeating unit (A-a), a repeating unit represented by Formula (A) is also preferable.

(A)

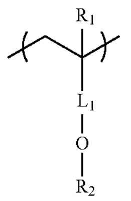

$L_1$ represents a divalent linking group which may have a fluorine atom or an iodine atom, $R_1$ represents a hydrogen atom, a fluorine atom, an iodine atom, a fluorine atom, an alkyl group which may have an iodine atom, or an aryl group which may have a fluorine atom or an iodine atom, and $R_2$ represents a leaving group that leaves by the action of an acid and may have a fluorine atom or an iodine atom. It should be noted that at least one of $L_1$, $R_1$, or $R_2$ has a fluorine atom or an iodine atom.

$L_1$ represents a divalent linking group which may have a fluorine atom or an iodine atom. Examples of the divalent linking group which may have a fluorine atom or an iodine atom include —CO—, —O—, —S—, —SO—, —$SO_2$—, a hydrocarbon group which may have a fluorine atom or an iodine atom (for example, an alkylene group, a cycloalkylene group, an alkenylene group, and an arylene group), and a linking group formed by the linking of a plurality of these groups. Among those, as $L_1$, —CO— or -arylene group-alkylene group having a fluorine atom or an iodine atom- is preferable.

As the arylene group, a phenylene group is preferable.

The alkylene group may be linear or branched. The number of carbon atoms of the alkylene group is not particularly limited, but is preferably 1 to 10, and more preferably 1 to 3.

The total number of fluorine atoms and iodine atoms included in the alkylene group having a fluorine atom or an iodine atom is not particularly limited, but is preferably 2 or more, more preferably 2 to 10, and still more preferably 3 to 6.

$R_1$ represents a hydrogen atom, a fluorine atom, an iodine atom, an alkyl group which may have a fluorine atom or an iodine atom, or an aryl group which may have a fluorine atom or an iodine atom.

The alkyl group may be linear or branched. The number of carbon atoms of the alkyl group is not particularly limited, but is preferably 1 to 10, and more preferably 1 to 3.

The total number of fluorine atoms and iodine atoms included in the alkyl group having a fluorine atom or an iodine atom is not particularly limited, but is preferably 1 or more, more preferably 1 to 5, and still more preferably 1 to 3.

The alkyl group may have a heteroatom such as an oxygen atom, other than a halogen atom.

$R_2$ represents a leaving group that leaves by the action of an acid and may have a fluorine atom or an iodine atom.

Among those, examples of the leaving group include groups represented by Formulae (Z1) to (Z4).

$—C(Rx_{11})(Rx_{12})(Rx_{13})$. Formula (Z1):

$—C(=O)OC(Rx_{11})(Rx_{12})(Rx_{13})$. Formula (Z2):

$—C(R_{136})(R_{137})(OR_{138})$. Formula (Z3):

$—C(Rn_1)(H)(Ar_1)$ Formula (Z4):

In Formulae (Z1) and (Z2), $Rx_{11}$ to $Rx_{13}$ each independently represent an (linear or branched) alkyl group which may have a fluorine atom or an iodine atom, or a (monocyclic or polycyclic) cycloalkyl group which may have a fluorine atom or an iodine atom. Furthermore, in a case where all of $Rx_{11}$ to $Rx_{13}$ are each an (linear or branched) alkyl group, it is preferable that at least two of $Rx_{11}$, $Rx_{12}$, or $Rx_{13}$ are methyl groups.

$Rx_{11}$ to $Rx_{13}$ are the same as $Rx_1$ to $Rx_3$ in Formulae (Y1) and (Y2) mentioned above, respectively, except that they may have a fluorine atom or an iodine atom, and have the same definitions and suitable ranges as those of the alkyl group and the cycloalkyl group.

In Formula (Z3), $R_{136}$ to $R_{138}$ each independently represent a hydrogen atom, or a monovalent organic group which may have a fluorine atom or an iodine atom. $R_{137}$ and $R_{138}$ may be bonded to each other to form a ring. Examples of the monovalent organic group which may have a fluorine atom or an iodine atom include an alkyl group which may have a fluorine atom or an iodine atom, a cycloalkyl group which may have a fluorine atom or an iodine atom, an aryl group which may have a fluorine atom or an iodine atom, an aralkyl group which may have a fluorine atom or an iodine atom, and a group formed by combination thereof (for example, a group formed by combination of the alkyl group and the cycloalkyl group).

Incidentally, the alkyl group, the cycloalkyl group, the aryl group, and the aralkyl group may include a heteroatom such as an oxygen atom, in addition to the fluorine atom and the iodine atom. That is, in the alkyl group, the cycloalkyl group, the aryl group, and the aralkyl group, for example, one of the methylene groups may be substituted with a heteroatom such as an oxygen atom or a group having a heteroatom, such as a carbonyl group.

As Formula (Z3), a group represented by Formula (Z3-1) is preferable.

(Z3-1)

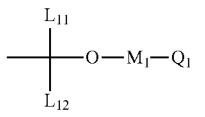

Here, $L_{11}$ and $L_{12}$ each independently represent a hydrogen atom; an alkyl group which may have a heteroatom selected from the group consisting of a fluorine atom, an iodine atom, and an oxygen atom; a cycloalkyl group which may have a heteroatom selected from the group consisting of a fluorine atom, an iodine atom, and an oxygen atom; an aryl group which may have a heteroatom selected from the group consisting of a fluorine atom, an iodine atom, and an oxygen atom; or a group formed by combination thereof (for example, a group formed by combination of an alkyl group and a cycloalkyl group, each of which may have a heteroatom selected from the group consisting of a fluorine atom, an iodine atom, and an oxygen atom).

$M_1$ represents a single bond or a divalent linking group.

$Q_1$ represents an alkyl group which may have a heteroatom selected from the group consisting of a fluorine atom, an iodine atom, and an oxygen atom; a cycloalkyl group which may have a heteroatom selected from the group consisting of a fluorine atom, an iodine atom, and an oxygen atom; an aryl group which may have a heteroatom selected from the group consisting of a fluorine atom, an iodine atom, and an oxygen atom; an amino group; an ammonium group; a mercapto group; a cyano group; an aldehyde group; a group formed by combination thereof (for example, a group formed by combination of the alkyl group and the cycloalkyl group, each of which may have a heteroatom selected from the group consisting of a fluorine atom, an iodine atom, and an oxygen atom).

In Formula (Z4), $Ar_1$ represents an aromatic ring group which may have a fluorine atom or an iodine atom. $Rn_1$ is an alkyl group which may have a fluorine atom or an iodine atom, a cycloalkyl group which may have a fluorine atom or an iodine atom, or an aryl group which may have a fluorine atom or an iodine atom. $Rn_1$ and $Ar_1$ may be bonded to each other to form a non-aromatic ring.

As the repeating unit (A-a), a repeating unit represented by General Formula (AI) is also preferable.

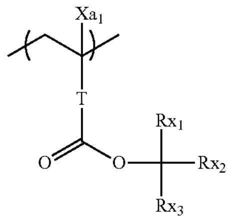

(AI)

In General Formula (AI), $Xa_1$ represents a hydrogen atom, or an alkyl group which may have a substituent.

T represents a single bond or a divalent linking group.

$Rx_1$ to $Rx_3$ each independently represent an (linear or branched) alkyl group or a (monocyclic or polycyclic) cycloalkyl group. It should be noted that in a case where all of $Rx_1$ to $Rx_3$ are (linear or branched) alkyl groups, it is preferable that at least two of $Rx_1$, $Rx_2$, or $Rx_3$ are methyl groups.

Two of $Rx_1$ to $Rx_3$ may be bonded to each other to form a (monocyclic or polycyclic) cycloalkyl group.

Examples of the alkyl group which may have a substituent, represented by $Xa_1$, include a methyl group and a group represented by $—CH_2—R_{11}$. $R_{11}$ represents a halogen atom (a fluorine atom or the like), a hydroxyl group, or a monovalent organic group, examples thereof include an alkyl group having 5 or less carbon atoms, which may be substituted with a halogen atom, an acyl group having 5 or less carbon atoms, which may be substituted with a halogen atom, and an alkoxy group having 5 or less carbon atoms, which may be substituted with a halogen atom; and an alkyl group having 3 or less carbon atoms is preferable, and a methyl group is more preferable. $Xa_1$ is preferably a hydrogen atom, a methyl group, a trifluoromethyl group, or a hydroxymethyl group.

Examples of the divalent linking group of T include an alkylene group, an aromatic ring group, a —COO-Rt- group, and an —O-Rt- group. In the formulae, Rt represents an alkylene group or a cycloalkylene group.

T is preferably the single bond or the —COO-Rt- group. In a case where T represents the —COO-Rt- group, Rt is preferably an alkylene group having 1 to 5 carbon atoms, and more preferably a $—CH_2—$ group, a $—(CH_2)_2—$ group, or a $—(CH_2)_3—$ group.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group is preferable, and in addition, a polycyclic cycloalkyl group such as a norbornyl group, a tetracyclodecanyl group, a tetracyclododecanyl group, and an adamantyl group is also preferable. Among those, a monocyclic cycloalkyl group having 5 or 6 carbon atoms is preferable.

In the cycloalkyl group formed by the bonding of two of $Rx_1$ to $Rx_3$, for example, one of the methylene groups constituting the ring may be substituted with a heteroatom such as an oxygen atom, or a group having a heteroatom, such as a carbonyl group.

With regard to the repeating unit represented by General Formula (AI), for example, an aspect in which $Rx_1$ is a methyl group or an ethyl group, and $Rx_2$ and $Rx_3$ are bonded to each other to form the above-mentioned cycloalkyl group is preferable.

In a case where each of the groups has a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The substituent preferably has 8 or less carbon atoms.

The repeating unit represented by General Formula (AI) is preferably an acid-decomposable tertiary alkyl (meth) acrylate ester-based repeating unit (the repeating unit in which $Xa_1$ represents a hydrogen atom or a methyl group, and T represents a single bond).

The resin (A) may have one kind of the repeating unit (A-a) alone or may have two or more kinds thereof.

A content of the repeating unit (A-a) (a total content in a case where two or more kinds of the repeating units (A-a) are present) is preferably 15% to 80% by mole, more preferably 15% to 70% by mole, and still more preferably 15% to 60% by mole with respect to all repeating units in the resin (A).

The resin (A) preferably has at least one repeating unit selected from the group consisting of repeating units represented by General Formulae (A-VIII) to (A-XII) as the repeating unit (A-a).

(A-VIII)

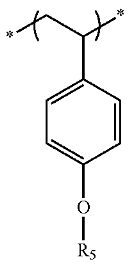

(A-IX)

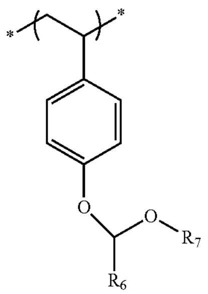

(A-X)

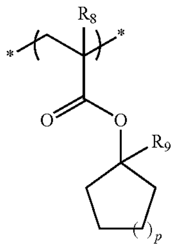

(A-XI)

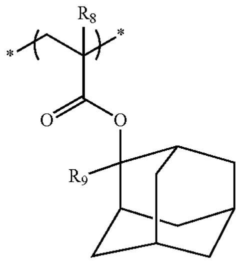

(A-XII)

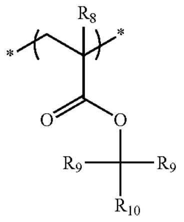

In General Formula (A-VIII), $R_5$ represents a tert-butyl group or a —CO—O-(tert-butyl) group.

In General Formula (A-IX), $R_6$ and $R_7$ each independently represent a monovalent organic group. Examples of the monovalent organic group include an alkyl group, a cycloalkyl group, an aryl group, an aralkyl group, and an alkenyl group.

In General Formula (A-X), p represents 1 or 2.

In General Formulae (A-X) to (A-XII), $R_8$ represents a hydrogen atom or an alkyl group having 1 to 3 carbon atoms, and $R_9$ represents an alkyl group having 1 to 3 carbon atoms.

In General Formula (A-XII), $R_{10}$ represents an alkyl group having 1 to 3 carbon atoms or an adamantyl group.

<Repeating Unit Having Acid Group>

The resin (A) may have a repeating unit having an acid group.

As the repeating unit having an acid group, a repeating unit represented by General Formula (B) is preferable.

(B)

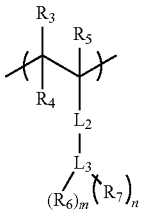

$R_3$ represents a hydrogen atom or a monovalent organic group which may have a fluorine atom or an iodine atom. The monovalent organic group which may have a fluorine atom or an iodine atom is preferably a group represented by $-L_4-R_8$. $L_4$ represents a single bond or an ester group. $R_8$ is an alkyl group which may have a fluorine atom or an iodine atom, a cycloalkyl group which may have a fluorine atom or an iodine atom, an aryl group which may have a fluorine atom or an iodine atom, or a group formed by combination thereof.

$R_4$ and $R_5$ each independently represent a hydrogen atom, a fluorine atom, an iodine atom, or an alkyl group which may have a fluorine atom or an iodine atom.

$L_2$ represents a single bond or an ester group.

$L_3$ represents an (n+m+1)-valent aromatic hydrocarbon ring group or an (n+m+1)-valent alicyclic hydrocarbon ring group. Examples of the aromatic hydrocarbon ring group include a benzene ring group and a naphthalene ring group. The alicyclic hydrocarbon ring group may be either a monocycle or a polycycle, and examples thereof include a cycloalkyl ring group.

$R_6$ represents a hydroxyl group or a fluorinated alcohol group (preferably a hexafluoroisopropanol group). Furthermore, in a case where $R_6$ is a hydroxyl group, $L_3$ is preferably the (n+m+1)-valent aromatic hydrocarbon ring group.

$R_7$ represents a halogen atom. Examples of the halogen atom include a fluorine atom, a chlorine atom, a bromine atom, or an iodine atom.

m represents an integer of 1 or more. m is preferably an integer of 1 to 3 and more preferably an integer of 1 or 2.

n represents 0 or an integer of 1 or more. n is preferably an integer of 1 to 4. Furthermore, (n+m+1) is preferably an integer of 1 to 5.

As the repeating unit having an acid group, a repeating unit represented by General Formula (I) is also preferable.

(I)

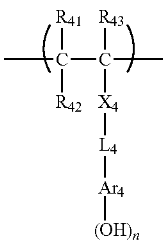

In General Formula (I), $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, in which case $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents an (n+1)-valent aromatic ring group, and in a case where $Ar_4$ is bonded to $R_{42}$ to form a ring, $Ar_4$ represents an (n+2)-valent aromatic ring group.

n represents an integer of 1 to 5.

As the alkyl group represented by each of $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group is preferable, an alkyl group having 8 or less carbon atoms is more preferable, and an alkyl group having 3 or less carbon atoms is still more preferable.

The cycloalkyl group of each of $R_{41}$, $R_{42}$, and $R_{43}$ in General Formula (I) may be monocyclic or polycyclic. Among those, a monocyclic cycloalkyl group having 3 to 8 carbon atoms, such as a cyclopropyl group, a cyclopentyl group, and a cyclohexyl group, is preferable.

Examples of the halogen atom of each of $R_{41}$, $R_{42}$, and $R_{43}$ in General Formula (I) include a fluorine atom, a chlorine atom, a bromine atom, and an iodine atom, and the fluorine atom is preferable.

As the alkyl group included in the alkoxycarbonyl group of each of $R_{41}$, $R_{42}$, and $R_{43}$ in General Formula (I), the same ones as the alkyl group in each of $R_{41}$, $R_{42}$, and $R_{43}$ are preferable.

$Ar_4$ represents an (n+1)-valent aromatic ring group. The divalent aromatic ring group in a case where n is 1 may have a substituent, and is preferably, for example, an arylene group having 6 to 18 carbon atoms, such as a phenylene group, a tolylene group, a naphthylene group, and an anthracenylene group, or an aromatic ring group including a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring.

Specific examples of the (n+1)-valent aromatic ring group in a case where n is an integer of 2 or more include groups formed by removing any (n−1) hydrogen atoms from the above-described specific examples of the divalent aromatic ring group. The (n+1)-valent aromatic ring group may further have a substituent.

Examples of the substituent which can be contained in the alkyl group, the cycloalkyl group, the alkoxycarbonyl group, the alkylene group, and the (n+1)-valent aromatic ring group, each mentioned above, include the alkyl groups; the alkoxy groups such as a methoxy group, an ethoxy group, a hydroxyethoxy group, a propoxy group, a hydroxypropoxy group, and a butoxy group; the aryl groups such as a phenyl group; and the like, as mentioned for each of $R_{41}$, $R_{42}$, and $R_{43}$ in General Formula (I).

Examples of the alkyl group of $R_{64}$ in —CONR$_{64}$— represented by $X_4$ ($R_{64}$ represents a hydrogen atom or an alkyl group) include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, and an alkyl group having 8 or less carbon atoms, is preferable.

As $X_4$, a single bond, —COO—, or —CONH— is preferable, and the single bond or —COO— is more preferable.

As the alkylene group in $L_4$, an alkylene group having 1 to 8 carbon atoms, such as a methylene group, an ethylene group, a propylene group, a butylene group, a hexylene group, and an octylene group, is preferable.

As $Ar_4$, an aromatic ring group having 6 to 18 carbon atoms is preferable, and a benzene ring group, a naphthalene ring group, and a biphenylene ring group are more preferable.

Specific examples of the repeating unit represented by General Formula (I) will be shown below, but the present invention is not limited thereto. In the formulae, a represents 1 or 2.

(B-1)

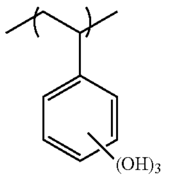

(B-2)

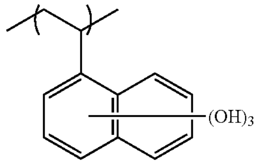

(B-3)

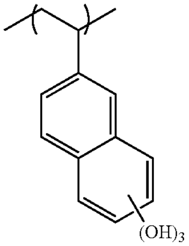

(B-4)

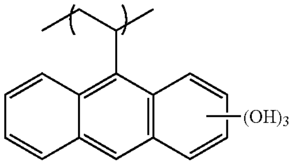

(B-5)

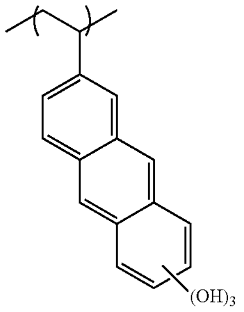

-continued
(B-6)
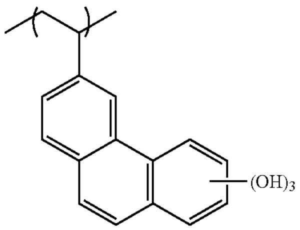
(B-7)
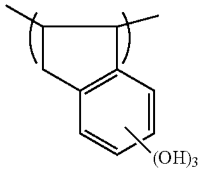
(B-8)
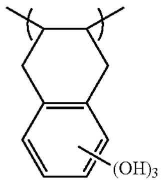
(B-9)
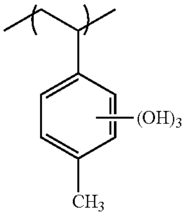
(B-10)
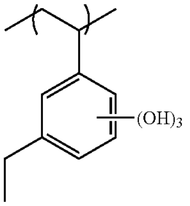
(B-11)
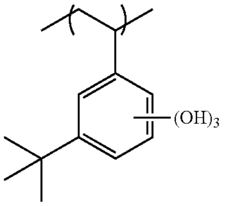
(B-12)
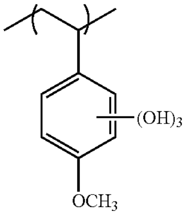
-continued
(B-13)
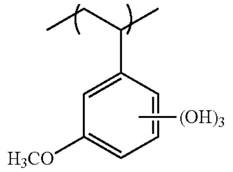
(B-14)
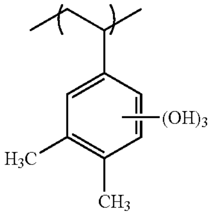
(B-15)
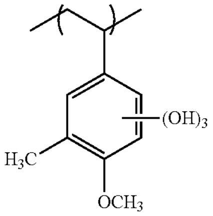
(B-16)
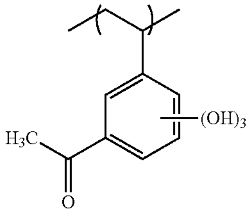
(B-17)
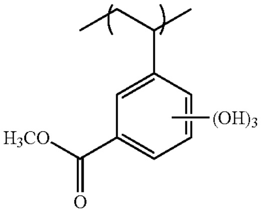
(B-18)
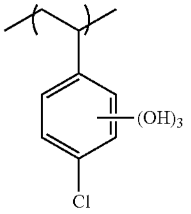
(B-19)
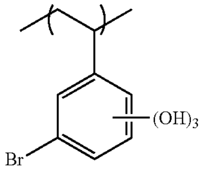

-continued
(B-20)
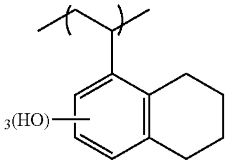
(B-21)
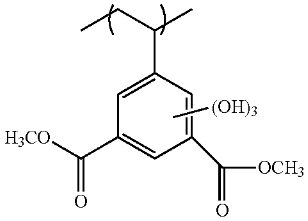
(B-22)
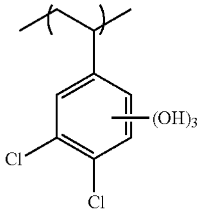
(B-23)
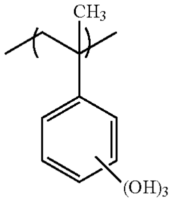
(B-24)
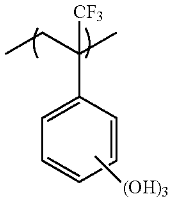
(B-25)
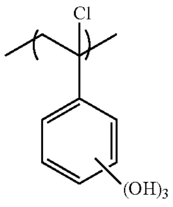
(B-26)
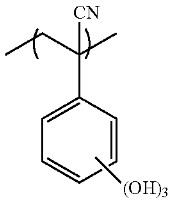
-continued
(B-27)
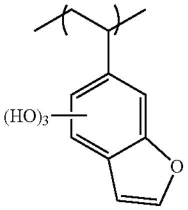
(B-28)
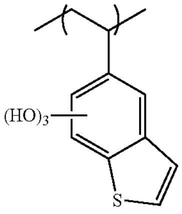
(B-29)
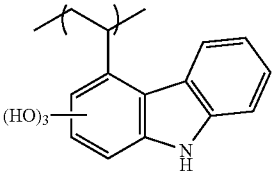
(B-30)
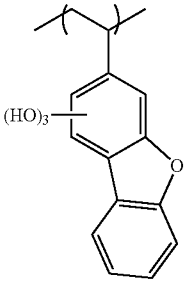
(B-31)
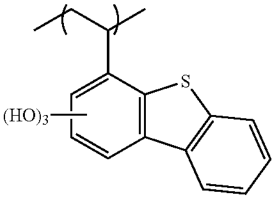
(B-32)
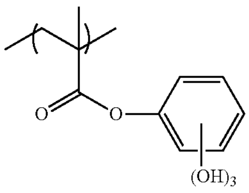
(B-33)
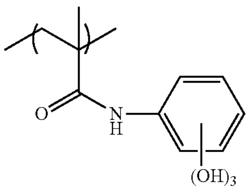

-continued (B-34)

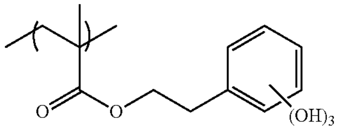

(B-35)

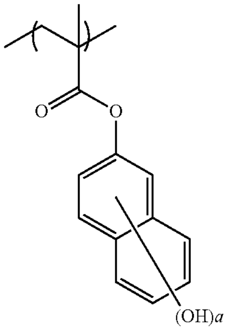

(B-36)

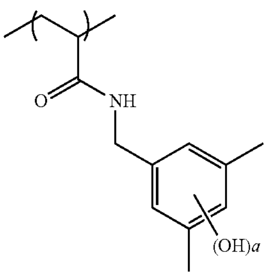

(B-37)

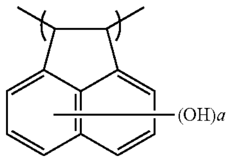

(B-38)

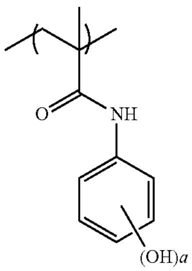

(Repeating Unit Derived from Hydroxystyrene (A-1))

The resin (A) preferably has a repeating unit (A-1) derived from hydroxystyrene as the repeating unit having an acid group.

Examples of the repeating unit (A-1) derived from hydroxystyrene include a repeating unit represented by General Formula (1).

(1)

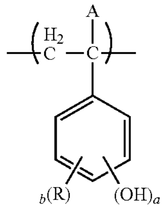

In General Formula (1),

A represents a hydrogen atom, an alkyl group, a cycloalkyl group, a halogen atom, or a cyano group.

R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group, or an aryloxycarbonyl group, and in a case where a plurality of R's are present, R's may be the same as or different from each other. In a case where there are a plurality of R's, R's may be bonded to each other to form a ring. As R, the hydrogen atom is preferable.

a represents an integer of 1 to 3, and b represents an integer of 0 to (5−a).

As the repeating unit (A-1), a repeating unit represented by General Formula (A-I) is preferable.

(A-I)

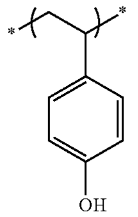

The composition including the resin (A) having the repeating unit (A-1) is preferable for KrF exposure. A content of the repeating unit (A-1) in such a case is preferably 30% by mole or more, more preferably 40% by mole or more, and still more preferably 50% by mole or more with respect to all repeating units in the resin (A). Furthermore, the upper limit value is not particularly limited, but is, for example, 100% by mole or less, and preferably 95% by mole or less.

<Repeating Unit (A-2) Having at Least One Selected from Group Consisting of Lactone Structure, Sultone Structure, Carbonate Structure, and Hydroxyadamantane Structure>

The resin (A) may have a repeating unit (A-2) having at least one selected from the group consisting of a lactone structure, a carbonate structure, a sultone structure, and a hydroxyadamantane structure.

The lactone structure or the sultone structure in a repeating unit having the lactone structure or the sultone structure is not particularly limited, but is preferably a 5- to 7-membered ring lactone structure or a 5- to 7-membered ring sultone structure, and more preferably a 5- to 7-membered ring lactone structure to which another ring structure is fused to form a bicyclo structure or a spiro structure, or a 5- to 7-membered ring sultone structure to which another ring structure is fused so as to form a bicyclo structure or a spiro structure.

Examples of the repeating unit having the lactone structure or the sultone structure include the repeating units described in paragraphs 0094 to 0107 of WO2016/136354A.

The resin (A) may have a repeating unit having a carbonate structure. The carbonate structure is preferably a cyclic carbonic acid ester structure.

Examples of the repeating unit having a carbonate structure include the repeating unit described in paragraphs 0106 to 0108 of WO2019/054311A.

The resin (A) may have a repeating unit having a hydroxyadamantane structure. Examples of the repeating unit having a hydroxyadamantane structure include a repeating unit represented by General Formula (AIIa).

(AIIa)

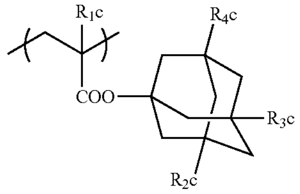

In General Formula (AIIa), $R_{1C}$ represents a hydrogen atom, a methyl group, a trifluoromethyl group, or a hydroxymethyl group. $R_{2C}$ to $R_{4C}$ each independently represent a hydrogen atom or a hydroxyl group. It should be noted that at least one of $R_{2C}$, . . . , or $R_{4C}$ represents a hydroxyl group. It is preferable that one or two of $R_{2C}$ to $R_{4C}$ are hydroxyl groups, and the rest are hydrogen atoms.

<Repeating Unit Having Fluorine Atom or Iodine Atom>

The resin (A) may have a repeating unit having a fluorine atom or an iodine atom.

Examples of the repeating unit having a fluorine atom or an iodine atom include the repeating units described in paragraphs 0080 and 0081 of JP2019-045864A.

<Repeating Unit Having Photoacid Generating Group>

The resin (A) may have, as a repeating unit other than those above, a repeating unit having a group that generates an acid upon irradiation with radiation.

Examples of the repeating unit having photoacid generating group include the repeating units described in paragraphs 0092 to 0096 of JP2019-045864A.

<Repeating Unit Having Alkali-Soluble Group>

The resin (A) may have a repeating unit having an alkali-soluble group.

Examples of the alkali-soluble group include a carboxyl group, a sulfonamide group, a sulfonylimide group, a bissulfonylimide group, or an aliphatic alcohol group (for example, a hexafluoroisopropanol group) in which the α-position is substituted with an electron-withdrawing group, and the carboxyl group is preferable. By allowing the resin (A) to have a repeating unit having an alkali-soluble group, the resolution for use in contact holes increases.

Examples of the repeating unit having an alkali-soluble group include a repeating unit in which an alkali-soluble group is directly bonded to the main chain of a resin such as a repeating unit with acrylic acid and methacrylic acid, or a repeating unit in which an alkali-soluble group is bonded to the main chain of the resin through a linking group. Furthermore, the linking group may have a monocyclic or polycyclic cyclic hydrocarbon structure.

The repeating unit having an alkali-soluble group is preferably a repeating unit with acrylic acid or methacrylic acid.

<Repeating Unit Having Neither Acid-Decomposable Group Nor Polar Group>

The resin (A) may further have a repeating unit having neither an acid-decomposable group nor a polar group. The repeating unit having neither an acid-decomposable group nor a polar group preferably has a hydrocarbon structure in a side chain.

Examples of the repeating unit having neither an acid-decomposable group nor a polar group include a repeating unit represented by General Formula (CX-1).

(CX-1)

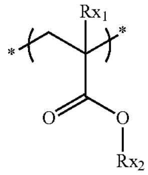

In General Formula (CX-1), $Rx_1$ represents a hydrogen atom, an alkyl group, or $—CH_2—O—Ra_2$ group. In the formula, $Ra_2$ represents a hydrogen atom, an alkyl group, or an acyl group.

$Rx_2$ represents a hydrocarbon group.

The number of carbon atoms of the hydrocarbon group represented by $Rx_2$ is preferably 6 to 20, and more preferably 6 to 10.

The hydrocarbon group may be any of linear, branched, and cyclic forms.

In addition, in a case where the hydrocarbon group has a cyclic structure or the hydrocarbon group includes a cyclic structure, the cyclic structure may be either an aromatic ring or an alicyclic ring, and may be either a monocycle or a polycycle. Incidentally, the cyclic structure may form a spiro structure and/or a bicyclo structure.

Specific examples of the hydrocarbon group represented by $Rx_2$ include a linear or branched hydrocarbon group having 6 to 20 carbon atoms (for example, a 2-ethylhexyl group), an alicyclic hydrocarbon group having 6 to 20 carbon atoms (for example, a cyclohexyl group), and an aralkyl group having 7 to 20 carbon atoms (a benzyl group).

Examples of the repeating unit having neither an acid-decomposable group nor a polar group include the repeating units described in paragraphs 0236 and 0237 of US2016/0026083A and the repeating units described in paragraph 0433 of US2016/0070167A.

In a case where the resin (A) has a repeating unit having neither an acid-decomposable group nor a polar group, a content of the repeating unit having neither an acid-decomposable group nor a polar group is preferably 1% by mole or more, more preferably 5% by mole or more, and still more preferably 10% by mole or more with respect to all the repeating units in the resin (A). Furthermore, the upper limit value is not particularly limited, but is, for example, 30% by mole or less, and preferably 25% by mole or less.

<Other Repeating Units>

The resin (A) may have a variety of repeating structural units, in addition to the repeating structural units described above, for the purpose of adjusting dry etching resistance, suitability for a standard developer, adhesiveness to a substrate, a resist profile, resolving power, heat resistance, sensitivity, and the like.

<Characteristics of Resin (A)>

In a case where the resist composition is for KrF exposure, the resin (A) preferably has a repeating unit having an aromatic hydrocarbon group, and more preferably has a repeating unit having a phenolic hydroxyl group. Examples of the repeating unit having a phenolic hydroxyl group include a repeating unit derived from hydroxystyrene (A-1) and a repeating unit derived from hydroxystyrene (meth) acrylate.

In addition, in a case where the resist composition is for KrF exposure, it is also preferable that the resin (A) has a repeating unit having a structure in which a hydrogen atom of the phenolic hydroxyl group is protected by a group (leaving group) that leaves through decomposition by the action of an acid.

In a case where the resist composition is for KrF exposure, a content of the repeating unit having an aromatic hydrocarbon group included in the resin (A) is preferably 30% to 100% by mole, more preferably 40% to 100% by mole, and still more preferably 50% to 100% by mole, with respect to all repeating units in the resin (A).

The resin (A) can be synthesized in accordance with an ordinary method (for example, radical polymerization).

The weight-average molecular weight (Mw) of the resin (A) is preferably 1,000 to 200,000, more preferably 3,000 to 20,000, and still more preferably 5,000 to 15,000. By setting the weight-average molecular weight (Mw) of the resin (A) to 1,000 to 200,000, it is possible to prevent deterioration of heat resistance and dry etching resistance, and it is also possible to prevent deterioration of the film forming property due to deterioration of developability and an increase in the viscosity. Incidentally, the weight-average molecular weight (Mw) of the resin (A) is a value expressed in terms of polystyrene as measured by the above-mentioned GPC method.

The dispersity (molecular weight distribution) of the resin (A) is usually 1 to 5, preferably 1 to 3, and more preferably 1.1 to 2.0. The smaller the dispersity, the better the resolution and the resist shape, and the smoother the side wall of a pattern, the more excellent the roughness.

The content of the resin (A) in the resist composition is preferably 50% to 99.9% by mass, and more preferably 60% to 99.0% by mass with respect to the total solid content of the composition.

In addition, the resin (A) may be used alone or in combination of two or more kinds thereof.

«Photoacid Generator (B)»

The resist composition includes a photoacid generator (hereinafter also referred to as "photoacid generator (B)").

The photoacid generator is a compound that generates an acid upon irradiation with actinic rays or radiation, and is a component that contributes to a deprotection reaction of a resin component (deprotection reaction of an acid-decomposable resin).

The photoacid generator (B) is preferably a compound that generates an organic acid upon irradiation with actinic rays or radiation. Examples thereof include a sulfonium salt compound, an iodonium salt compound, a diazonium salt compound, a phosphonium salt compound, an imidosulfonate compound, an oxime sulfonate compound, a diazodisulfone compound, a disulfone compound, and an o-nitrobenzyl sulfonate compound.

As the photoacid generator (B), known compounds that generate an acid upon irradiation with actinic rays or radiation can be appropriately selected and used singly or as a mixture thereof. For example, the known compounds disclosed in paragraphs [0125] to [0319] of US2016/0070167A1, paragraphs [0086] to [0094] of US2015/0004544A1, and paragraphs [0323] to [0402] of US2016/0237190A1 an be suitably used as the photoacid generator (B).

As the photoacid generator (B), for example, a compound represented by General Formula (ZI), General Formula (ZII), or General Formula (ZIII) is preferable.

(ZI)

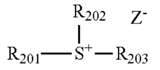

(ZII)

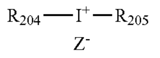

(ZIII)

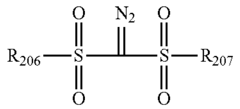

In General Formula (ZI), $R_{201}$, $R_{202}$, and $R_{203}$ each independently represent an organic group.

The organic group as each of $R_{201}$, $R_{202}$, and $R_{203}$ generally has 1 to 30 carbon atoms, and preferably has 1 to 20 carbon atoms.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two of $R_{201}$ to $R_{203}$ include an alkylene group (for example, a butylene group and a pentylene group) and $-CH_2-CH_2-O-CH_2-CH_2-$.

$Z^-$ represents an anion.

Suitable aspects of the cation in General Formula (ZI) include the corresponding groups in a compound (ZI-1), a compound (ZI-2), a compound (ZI-3), a compound (ZI-4), and a compound (ZI-5) which will be described later.

Furthermore, the photoacid generator (B) may be a compound having a plurality of structures represented by General Formula (ZI). For example, the photoacid generator may be a compound having a structure in which at least one of $R_{201}$, $R_{202}$, or $R_{203}$ of the compound represented by General Formula (ZI) and at least one of $R_{201}$, $R_{202}$, or $R_{203}$ of another compound represented by General Formula (ZI) are bonded via a single bond or a linking group.

First, the compound (ZI-1) will be described.

The compound (ZI-1) is an arylsulfonium compound in which at least one of $R_{201}$, $R_{202}$, or $R_{203}$ in General Formula (ZI) is an aryl group, that is, a compound having arylsulfonium as a cation.

In the arylsulfonium compound, all of $R_{201}$ to $R_{203}$ may be aryl groups, or some of $R_{201}$ to $R_{203}$ may be aryl groups and the remainders may be alkyl groups or cycloalkyl groups.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

As the aryl group included in the arylsulfonium compound, a phenyl group or a naphthyl group is preferable, and the phenyl group is more preferable. The aryl group may be an aryl group which has a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, the two or more aryl groups may be the same as or different from each other.

The alkyl group or the cycloalkyl group contained in the arylsulfonium compound, as necessary, is preferably a linear alkyl group having 1 to 15 carbon atoms, a branched alkyl group having 3 to 15 carbon atoms, or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group represented by each of $R_{201}$ to $R_{203}$ may each independently have an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group as a substituent.

Next, the compound (ZI-2) will be described.

The compound (ZI-2) is a compound in which $R_{201}$ to $R_{203}$ in Formula (ZI) each independently represent an organic group having no aromatic ring. Here, the aromatic ring also includes an aromatic ring including a heteroatom.

The organic group having no aromatic ring as each of $R_{201}$ to $R_{203}$ generally has 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably the linear or branched 2-oxoalkyl group.

As the alkyl group and the cycloalkyl group of each of $R_{201}$ to $R_{203}$, a linear alkyl group having 1 to 10 carbon atoms or branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group) is preferable.

$R_{201}$ to $R_{203}$ may be further substituted with a halogen atom, an alkoxy group (for example, having 1 to 5 carbon atoms), a hydroxyl group, a cyano group, or a nitro group.

Next, the compound (ZI-3) will be described.

The compound (ZI-3) is a compound represented by General Formula (ZI-3) and having a phenacylsulfonium salt structure.

(ZI-3)

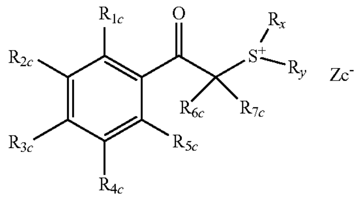

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Any two or more of $R_{1c}$, . . . , or $R_{5c}$, $R_{5c}$ and $R_{6c}$, $R_{6c}$ and $R_{7c}$, $R_{5c}$ and $R_x$, and $R_x$ and $R_y$ may be bonded to each other to form a ring structure, and the ring structure may each independently include an oxygen atom, a sulfur atom, a ketone group, an ester bond, or an amide bond.

Examples of the ring structure include an aromatic or non-aromatic hydrocarbon ring, an aromatic or non-aromatic heterocyclic ring, and a polycyclic fused ring in which two or more of these rings are combined. Examples of the ring structure include a 3- to 10-membered ring and the ring structure is preferably a 4- to 8-membered ring, and more preferably a 5- or 6-membered ring.

Examples of the group formed by the bonding of any two or more of $R_{1c}$, . . . , or $R_{5c}$, $R_{6c}$ and $R_{7c}$, and $R_x$ and $R_y$ include a butylene group and a pentylene group.

As the group formed by the bonding of $R_{5c}$ and $R_{6c}$, and $R_{5c}$ and $R_x$, a single bond or an alkylene group is preferable. Examples of the alkylene group include a methylene group and an ethylene group.

$Zc^-$ represents an anion.

Next, the compound (ZI-4) will be described.

The compound (ZI-4) is represented by General Formula (ZI-4).

(ZI-4)

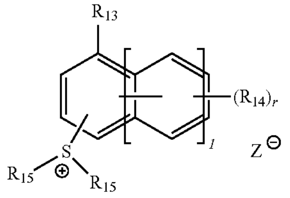

In General Formula (ZI-4), l represents an integer of 0 to 2.

r represents an integer of 0 to 8.

$R_{13}$ represents a group having a hydrogen atom, a fluorine atom, a hydroxyl group, an alkyl group, a cycloalkyl group, an alkoxy group, an alkoxycarbonyl group, or a cycloalkyl group. These groups may have a substituent.

$R_{14}$ represents a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent. In a case where Ria's are present in a plural number, they each independently represent the group such as a hydroxyl group.

$R_{15}$'s each independently represent an alkyl group, a cycloalkyl group, or a naphthyl group. These groups may have a substituent. Two $R_{15}$'s may be bonded to each other to form a ring. In a case where two $R_{15}$'s are bonded to each other to form a ring, the ring skeleton may include a heteroatom such as an oxygen atom and a nitrogen atom. In one aspect, it is preferable that two $R_{15}$'s are alkylene groups and are bonded to each other to form a ring structure.

$Z^-$ represents an anion.

In General Formula (ZI-4), the alkyl groups represented by $R_{13}$, $R_{14}$, and $R_{15}$ are linear or branched. The alkyl group preferably has 1 to 10 carbon atoms. As the alkyl group, a methyl group, an ethyl group, an n-butyl group, or a t-butyl group is preferable.

Next, the compound (ZI-5) will be described.

The compound (ZI-5) is a compound represented by General Formula (ZI-5) and having a phenacylsulfonium salt structure.

(ZI-5)

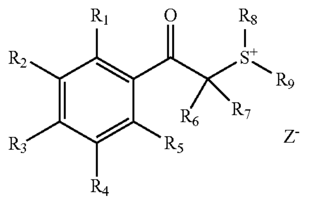

$R_1$ to $R_5$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

The above-mentioned alkyl group, cycloalkyl group, alkoxy group, alkoxycarbonyl group, alkylcarbonyloxy group, cycloalkylcarbonyloxy group, and alkylthio group each have, for example, preferably 1 to 20 carbon atoms, and more preferably 1 to 10 carbon atoms.

The above-mentioned aryl group, aryloxy group, and arylthio group have, for example, preferably 6 to 20 carbon atoms, and more preferably 6 to 10 carbon atoms.

It should be noted that at least one of $R_1$, . . . , or $R_5$ is an alkyl group having 3 or more carbon atoms or an alkoxy group having 3 or more carbon atoms. The above-mentioned alkyl group and alkoxy group preferably have 3 to 10 carbon atoms, and more preferably have 3 to 6 carbon atoms from the viewpoint that the amount of particles generated in the resist composition can be further reduced.

The alkyl group, the cycloalkyl group, the aryl group, the alkoxy group, an aryloxy group, the alkoxycarbonyl group, the alkylcarbonyloxy group, the cycloalkylcarbonyloxy group, the alkylthio group, and the arylthio group represented by each of $R_1$ to $R_5$ may be further substituted with a substituent.

$R_6$ and $R_7$ each independently represent a hydrogen atom, an alkyl group, a cycloalkyl group, a halogen atom, a cyano group, or an aryl group.

The above-mentioned alkyl group and cycloalkyl group each have, for example, preferably 1 to 20 carbon atoms, and more preferably 1 to 10 carbon atoms.

The above-mentioned aryl group preferably has 6 to 20 carbon atoms, and more preferably has 6 to 10 carbon atoms.

The alkyl group, the cycloalkyl group, and the aryl group represented by each of $R_6$ and $R_7$ may further have a substituent.

$R_5$ and $R_9$ each independently represent an alkyl group, a cycloalkyl group, or an alkenyl group.

The above-mentioned alkyl group and cycloalkyl group each have, for example, preferably 1 to 20 carbon atoms, and more preferably 1 to 10 carbon atoms.

The above-mentioned alkenyl group has, for example, preferably 2 to 20 carbon atoms, and more preferably 2 to 10 carbon atoms, and the alkenyl group is still more preferably an allyl group or a vinyl group.

The alkyl group, the cycloalkyl group, and the alkenyl group represented by each of $R_5$ and $R_9$ may further have a substituent.

$R_5$ and $R_9$ may be bonded to each other to form a ring structure. The ring structure formed by the mutual bonding of $R_5$ and $R_9$ may include a heteroatom (an example of the heteroatom includes an oxygen atom and a nitrogen atom, and the heteroatom may be included in the form of a ketone group, an ester bond, an amide bond, or the like) in the ring skeleton. Examples of the ring structure include an aromatic or non-aromatic hydrocarbon ring, an aromatic or non-aromatic heterocyclic ring, and a polycyclic fused ring in which two or more of these rings are combined. Examples of the ring structure include a 3- to 10-membered ring and the ring structure is preferably a 4- to 8-membered ring, and more preferably a 5- or 6-membered ring.

In addition, any two or more of $R_1$, $R_5$, $R_6$, or $R_7$ may be bonded to each other to form a ring structure. The ring structure formed by the mutual bonding of any two or more of $R_1$, $R_5$, $R_6$, or $R_7$ may include a carbon-carbon double bond in the ring skeleton. Examples of the ring structure include an aromatic or non-aromatic hydrocarbon ring, and a polycyclic fused ring in which two or more of these rings are combined. Examples of the ring structure include a 3- to 10-membered ring and the ring structure is preferably a 4- to 8-membered ring, and more preferably a 5- or 6-membered ring.

$Z^-$ represents an anion.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

The aryl group represented by each of $R_{204}$ to $R_{207}$ is preferably a phenyl group or a naphthyl group, and more preferably the phenyl group. The aryl group represented by each of $R_{204}$ to $R_{207}$ may be an aryl group having a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

As the alkyl group and the cycloalkyl group of each of $R_{204}$ to $R_{207}$, a linear alkyl group having 1 to 10 carbon atoms or branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group) is preferable.

The aryl group, the alkyl group, and the cycloalkyl group represented by each of $R_{204}$ to $R_{207}$ may each independently have a substituent. Examples of the substituent which may be contained in each of the aryl group, the alkyl group, and the cycloalkyl group represented by each of $R_{204}$ to $R_{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion.

As $Z^-$ in General Formula (ZI), $Z^-$ in General Formula (ZII), $Zc^-$ in General Formula (ZI-3), $Z^-$ in General Formula (ZI-4), and $Z^-$ in General Formula (ZI-5), an anion represented by General Formula (3) is preferable.

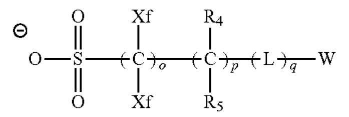

(3)

In General Formula (3), o represents an integer of 1 to 3. p represents an integer of 0 to 10. q represents an integer of 0 to 10.

Xf represents a fluorine atom or an alkyl group substituted with at least one fluorine atom. The alkyl group preferably has 1 to 10 carbon atoms, and more preferably has 1 to 4 carbon atoms. In addition, a perfluoroalkyl group is preferable as the alkyl group substituted with at least one fluorine atom.

Xf is preferably the fluorine atom or a perfluoroalkyl group having 1 to 4 carbon atoms, and more preferably the fluorine atom or $CF_3$. In particular, it is still more preferable that both Xf's are fluorine atoms.

$R_4$ and $R_5$ each independently represent a hydrogen atom, a fluorine atom, an alkyl group, or an alkyl group substituted with at least one fluorine atom. In a case where $R_4$'s and $R_5$'s are each present in a plural number, $R_4$'s and $R_5$'s may each be the same as or different from each other.

The alkyl group represented by each of $R_4$ and $R_5$ may have a substituent, and preferably has 1 to 4 carbon atoms. $R_4$ and $R_5$ are each preferably a hydrogen atom.

Specific examples and suitable aspects of the alkyl group substituted with at least one fluorine atom are the same ones as the specific examples and the suitable aspects of Xf in General Formula (3), respectively.

L represents a divalent linking group. In a case where L's are present in a plural number, they may be the same as or different from each other.

Examples of the divalent linking group include —COO—, —CONH—, —CO—, —O—, —S—, —SO—, —$SO_2$—, an alkylene group (preferably having 1 to 6 carbon atoms), a cycloalkylene group (preferably having 3 to 15 carbon atoms), an alkenylene group (preferably having 2 to 6 carbon atoms), and a divalent linking group formed by combination of a plurality of these groups. Among these, —COO—, —CONH—, —CO—, —O—, —$SO_2$—, —COO-alkylene group-, —OCO-alkylene group-, —CONH-alkylene group-, or —NHCO-alkylene group- is preferable, and —COO—, —CONH—, —$SO_2$—, —COO-alkylene group-, or —OCO-alkylene group- is more preferable.

W represents an organic group including a cyclic structure. Among those, W is preferably a cyclic organic group.

Examples of the cyclic organic group include an alicyclic group, an aryl group, and a heterocyclic group.

The alicyclic group may be monocyclic or polycyclic. Examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group, is preferable.

The aryl group may be monocyclic or polycyclic. Examples of the aryl group include a phenyl group, a naphthyl group, a phenanthryl group, and an anthryl group.

The heterocyclic group may be monocyclic or polycyclic. The polycyclic heterocyclic group can further suppress acid diffusion. Furthermore, the heterocyclic group may have aromaticity or may not have aromaticity. Examples of the heterocyclic group having aromaticity include a furan ring, a thiophene ring, a benzofuran ring, a benzothiophene ring, a dibenzofuran ring, a dibenzothiophene ring, and a pyridine ring. Examples of the heterocyclic group not having aromaticity include a tetrahydropyran ring, a lactone ring, a sultone ring, and a decahydroisoquinoline ring. Examples of the lactone ring and the sultone ring include the lactone structure and the sultone structure exemplified in the aforementioned resin. As the heterocyclic ring in the heterocyclic group, the furan ring, the thiophene ring, the pyridine ring, or the decahydroisoquinoline ring is particularly preferable.

The cyclic organic group may have a substituent. Examples of the substituent include an alkyl group (which may be either linear or branched, preferably having 1 to 12 carbon atoms), a cycloalkyl group (which may be any of a monocycle, a polycycle, and a spirocycle, and preferably has 3 to 20 carbon atoms), an aryl group (preferably having 6 to 14 carbon atoms), a hydroxyl group, an alkoxy group, an ester group, an amide group, a urethane group, a ureide group, a thioether group, a sulfonamide group, and a sulfonic acid ester group. Incidentally, the carbon constituting the cyclic organic group (carbon contributing to ring formation) may be carbonyl carbon.

As the anion represented by General Formula (3), $SO_3^-$—$CF_2$—$CH_2$—OCO-(L)q'-W, $SO_3^-$—$CF_2$—CHF—$CH_2$—OCO-(L)q'-W, $SO_3^-$—$CF_2$—COO-(L)q'-W, $SO_3^-$—$CF_2$—$CF_2$—$CH_2$—$CH_2$-(L)q-W, or $SO_3^-$—$CF_2$—$CH(CF_3)$—OCO-(L)q'-W is preferable. Here, L, q, and W are each the same as in General Formula (3). q' represents an integer of 0 to 10.

In one aspect, as $Z^-$ in General Formula (ZI), $Z^-$ in General Formula (ZII), $Zc^-$ in General Formula (ZI-3), $Z^-$ in General Formula (ZI-4), and $Z^-$ in General Formula (ZI-5), an anion represented by General Formula (4) is also preferable.

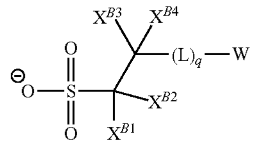

(4)

In General Formula (4), $X^{B1}$ and $X^{B2}$ each independently represent a hydrogen atom or a monovalent organic group having no fluorine atom. It is preferable that $X^{B1}$ and $X^{B2}$ are each the hydrogen atom.

$X^{B3}$ and $X^{B4}$ each independently represent a hydrogen atom or a monovalent organic group. It is preferable that at least one of $X^{B3}$ or $X^{B4}$ is a fluorine atom or a monovalent organic group having a fluorine atom, and it is more preferable that both of $X^{B3}$ and $X^{B4}$ are fluorine atoms or monovalent organic groups having a fluorine atom. It is still more preferable that both $X^{B3}$ and $X^{B4}$ are fluorine-substituted alkyl groups.

L, q, and W are the same as in General Formula (3).

As $Z^-$ in General Formula (ZI), $Z^-$ in General Formula (ZII), $Zc^-$ in General Formula (ZI-3), $Z^-$ in General Formula (ZI-4), and $Z^-$ in General Formula (ZI-5), an anion represented by General Formula (5) is preferable.

(5)

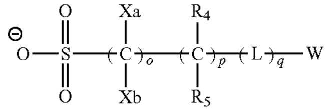

In General Formula (5), Xa's each independently represent a fluorine atom or an alkyl group substituted with at least one fluorine atom. Xb's each independently represent a hydrogen atom or an organic group having no fluorine atom. The definitions and preferred aspects of o, p, q, $R_4$, $R_5$, L, and W are each the same as those in General Formula (3).

$Z^-$ in General Formula (ZI), $Z^-$ in General Formula (ZII), $Zc^-$ in General Formula (ZI-3), $Z^-$ in General Formula (ZI-4), and $Z^-$ in General Formula (ZI-5) may be a benzenesulfonate anion, and are each preferably a benzenesulfonate anion substituted with a branched alkyl group or a cycloalkyl group.

As $Z^-$ in General Formula (ZI), $Z^-$ in General Formula (ZII), $Zc^-$ in General Formula (ZI-3), $Z^-$ in General Formula (ZI-4), and $Z^-$ in General Formula (ZI-5), an aromatic sulfonate anion represented by General Formula (SA1) is also preferable.

(SA1)

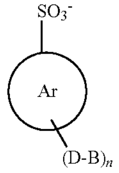

In Formula (SA1),

Ar represents an aryl group, and may further have a substituent other than a sulfonate anion and a -(D-B) group. Examples of the substituent which may be further contained include a fluorine atom and a hydroxyl group.

n represents an integer of 0 or more. n is preferably 1 to 4, more preferably 2 or 3, and still more preferably 3.

D represents a single bond or a divalent linking group. Examples of the divalent linking group include an ether group, a thioether group, a carbonyl group, a sulfoxide group, a sulfone group, a sulfonic acid ester group, an ester group, and a group consisting of a combination of two or more of these.

B represents a hydrocarbon group.

It is preferable that D is the single bond and B is an aliphatic hydrocarbon structure. It is more preferable that B is an isopropyl group or a cyclohexyl group.

As $Z^-$ in General Formula (ZI), $Z^-$ in General Formula (ZII), $Zc^-$ in General Formula (ZI-3), $Z^-$ in General Formula (ZI-4), and $Z^-$ in General Formula (ZI-5), a perfluoroalkyl sulfonate anion is also preferable.

The perfluoroalkyl sulfonate anion preferably has 1 to 12 carbon atoms, more preferably has 2 to 10 carbon atoms, and still more preferably has 2 to 6 carbon atoms. Specific examples of the perfluoroalkyl sulfonate anion include $C_4F_9SO_3^-$.

Preferred examples of the sulfonium cation in General Formula (ZI) and the iodonium cation in General Formula (ZII) are shown below.

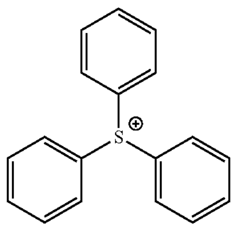

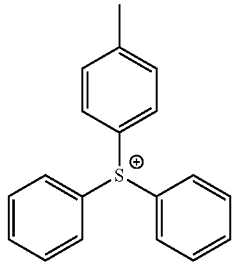

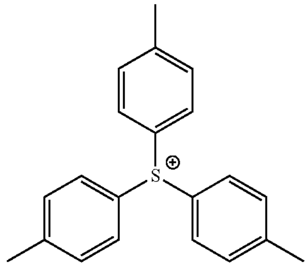

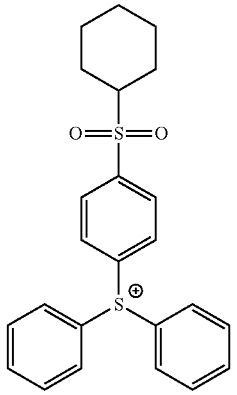

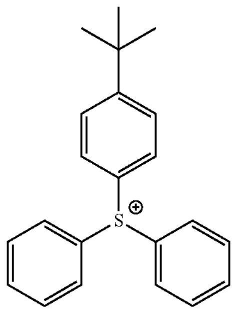

-continued
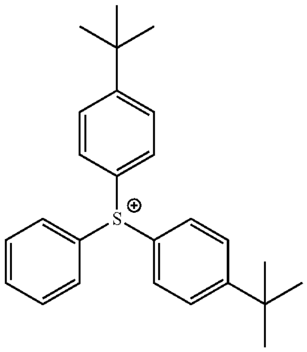
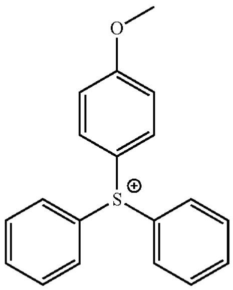
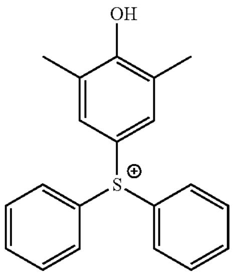
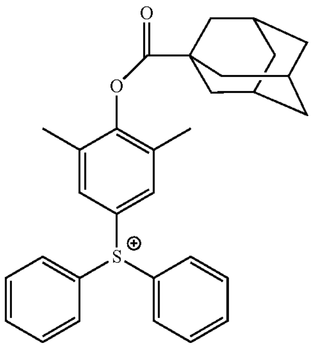
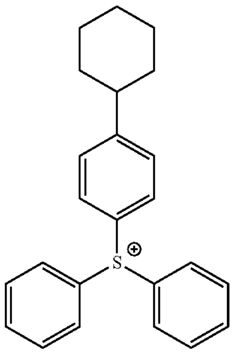
-continued
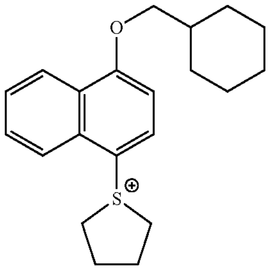
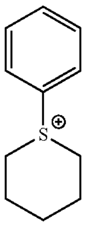
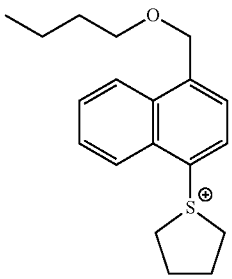
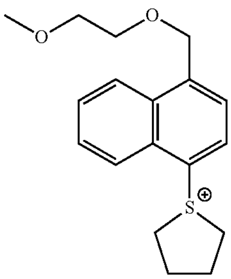
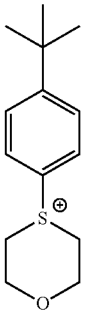
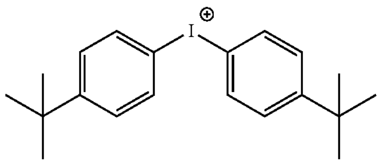
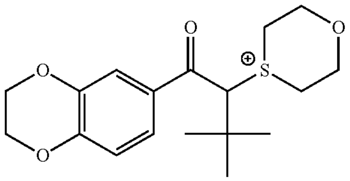
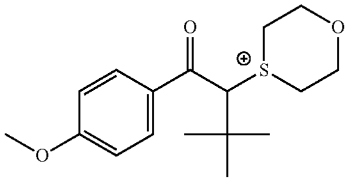
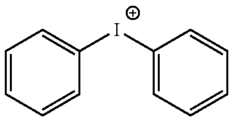
Preferred examples of the anion $Z^-$ in General Formula (ZI), the anion $Z^-$ in General Formula (ZII), $Zc^-$ in General Formula (ZI-3), $Z^-$ in General Formula (ZI-4), and $Z^-$ in General Formula (ZI-5) are shown below.
Furthermore, as $Z^-$, in addition to those shown below, perfluoroalkyl sulfonate anions such as $C_4F_9SO_3^-$ are also preferable.

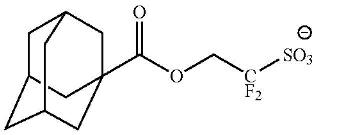
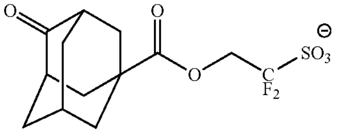
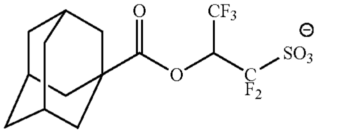
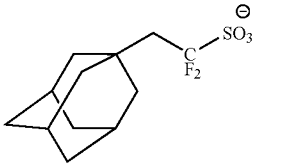
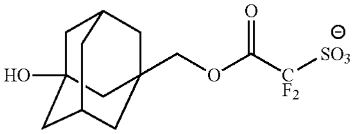
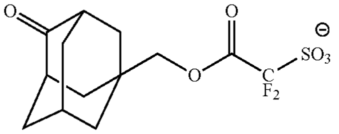
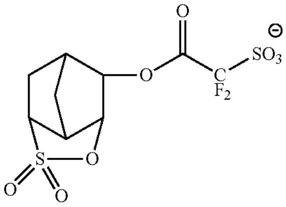
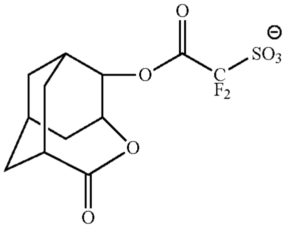
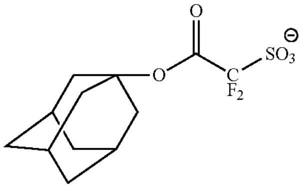
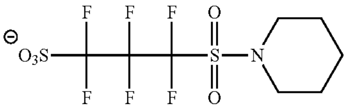
-continued
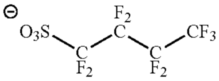
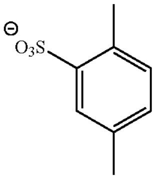
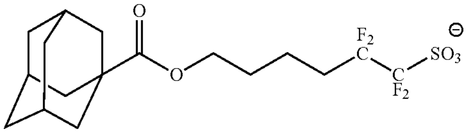
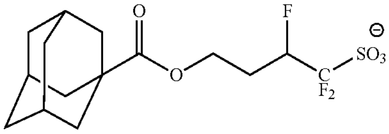
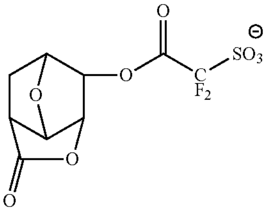
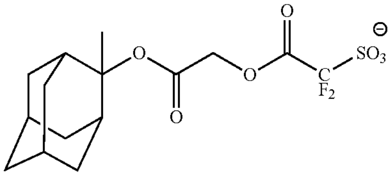
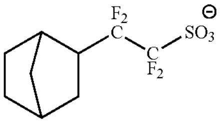
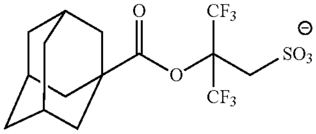
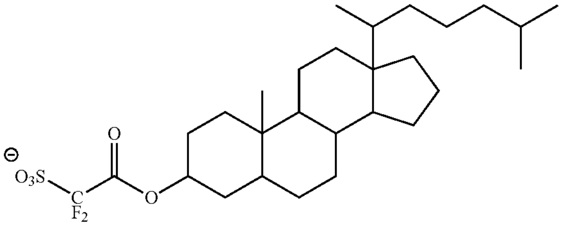
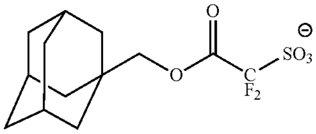
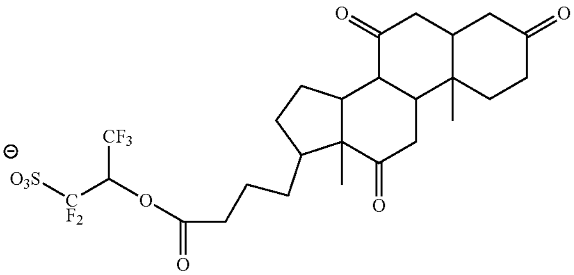

-continued

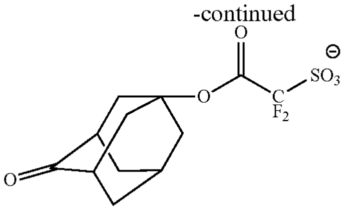

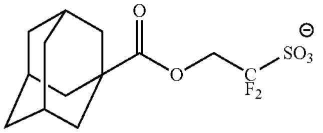

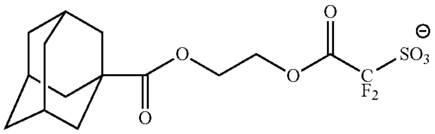

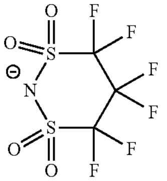

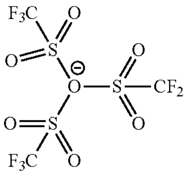

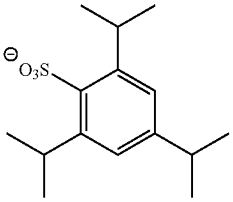

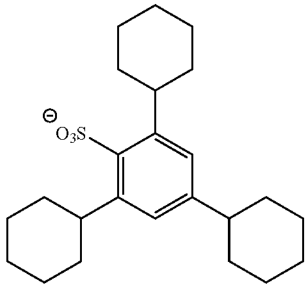

Any combination of the cations and the anions can be used as the photoacid generator (B).

The photoacid generator (B) may be in a form of a low-molecular-weight compound or a form incorporated into a part of a polymer. Furthermore, a combination of the form of a low-molecular-weight compound and the form incorporated into a part of a polymer may also be used.

The photoacid generator (B) is preferably in the form of a low-molecular-weight compound.

In a case where the photoacid generator (B) is in the form of a low-molecular-weight compound, the molecular weight is preferably 3,000 or less, more preferably 2,000 or less, and still more preferably 1,000 or less.

In a case where the photoacid generator (B) is in the form incorporated into a part of a polymer, it may be incorporated into the part of the above-mentioned resin (A) or into a resin that is different from the resin (A).

The photoacid generator preferably includes a compound having a phenacylsulfonium salt structure from the viewpoint that the resolution is more excellent. Among those, as the compound having a phenacylsulfonium salt structure, the above-mentioned compound represented by General Formula (ZI-5) is preferable from the viewpoint that the amount of particles generated in the resist composition can be further reduced, as described later.

A content of the photoacid generator (B) is not particularly limited, but is preferably 0.1% to 20% by mass, more preferably 0.5% to 15% by mass, and still more preferably 0.5% to 10% by mass with respect to the total solid content of the composition.

The photoacid generators (B) may be used alone or in combination of two or more kinds thereof. In a case where two or more kinds of the photoacid generators (B) are used in combination, the total amount thereof is preferably within the range.

The acid dissociation constant pKa of an acid generated by decomposition of the photoacid generator (B) upon irradiation with actinic rays or radiation is, for example, −0.01 or less, preferably −1.00 or less, more preferably −1.50 or less, and still more preferably −2.00 or less. A lower limit value of the pKa is not particularly limited, but is, for example, −5.00 or more. The pKa can be measured by the above-mentioned method.

«Solvent (F)»

The resist composition includes a solvent (F).

The solvent is not particularly limited, but from the viewpoint of the in-plane uniformity of a film thickness at the time of application, the solvent is preferably an organic solvent having a boiling point (which means a boiling point at 1 atm) of 160° C. or lower.

As the solvent, a solvent including at least one solvent of (M1) propylene glycol monoalkyl ether carboxylate, or (M2) at least one selected from the group consisting of a propylene glycol monoalkyl ether, a lactic acid ester, an acetic acid ester, butyl butyrate, an alkoxypropionic acid ester, a chain ketone, a cyclic ketone, a lactone, and an alkylene carbonate is preferable. Furthermore, this solvent may further include components other than the components (M1) and (M2).

The solvent including the component (M1) or (M2) is preferable since a use of the solvent in combination with the above-mentioned resin (A) makes it possible to form a pattern having a small number of development defects while improving the coating property of the composition.

As the component (M1), one or more selected from the group consisting of propylene glycol monomethyl ether acetate (PGMEA), propylene glycol monomethyl ether propionate, and propylene glycol monoethyl ether acetate are preferable, and the propylene glycol monomethyl ether acetate (PGMEA) is more preferable.

As the component (M2), the following ones are preferable.

As the propylene glycol monoalkyl ether, propylene glycol monomethyl ether (PGME) or propylene glycol monoethyl ether (PGEE) is preferable.

As the lactic acid ester, ethyl lactate, butyl lactate, or propyl lactate is preferable.

As the acetic acid ester, methyl acetate, ethyl acetate, isobutyl acetate, propyl acetate, isoamyl acetate, methyl formate, ethyl formate, butyl formate, propyl formate, or 3-methoxybutyl acetate is preferable.

As the alkoxypropionic acid ester, methyl 3-methoxypropionate (MMP) or ethyl 3-ethoxypropionate (EEP) is preferable.

As the chain ketone, 1-octanone, 2-octanone, 1-nonanone, 2-nonanone, acetone, 2-heptanone, 4-heptanone, 1-hexanone, 2-hexanone, diisobutyl ketone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, or methyl amyl ketone is preferable.

As the cyclic ketone, methylcyclohexanone, isophorone, cyclohexanone, or cyclopentanone is preferable.

As the lactone, γ-butyrolactone is preferable.

As the alkylene carbonate, propylene carbonate is preferable.

As the component (M2), propylene glycol monomethyl ether (PGME), ethyl lactate, ethyl 3-ethoxypropionate, methyl amyl ketone, cyclohexanone, butyl acetate, pentyl acetate, γ-butyrolactone, or propylene carbonate is more preferable, and propylene glycol monomethyl ether (PGME), ethyl lactate, cyclohexanone, or γ-butyrolactone is still more preferable.

In addition to the components, it is preferable to use an ester-based solvent having 7 or more carbon atoms (preferably 7 to 14 carbon atoms, more preferably 7 to 12 carbon atoms, and still more preferably 7 to 10 carbon atoms) and 2 or less heteroatoms.

As the ester-based solvent having 7 or more carbon atoms and 2 or less heteroatoms, amyl acetate, 2-methylbutyl acetate, 1-methylbutyl acetate, hexyl acetate, pentyl propionate, hexyl propionate, butyl propionate, isobutyl isobutyrate, heptyl propionate, or butyl butanoate is preferable, and isoamyl acetate is more preferable.

As the component (M2), a component having a flash point (hereinafter also referred to as fp) of 37° C. or higher is preferably used. As such a component (M2), propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), methyl 2-hydroxyisobutyrate (fp: 45° C.), γ-butyrolactone (fp: 101° C.), or propylene carbonate (fp: 132° C.) is preferable. Among those, propylene glycol monoethyl ether, ethyl lactate, pentyl acetate, or cyclohexanone is more preferable, and propylene glycol monoethyl ether or ethyl lactate is still more preferable.

In addition, "flash point" herein means the value described in a reagent catalog of Tokyo Chemical Industry Co., Ltd. or Sigma-Aldrich Co. LLC.

The mixing mass ratio (M1/M2) of the content of the component (M1) to the component (M2) in the mixed solvent is preferably in the range of "100/0" to "15/85", and more preferably in the range of "100/0" to "40/60". In a case where such a configuration is adopted and used, it is possible to further reduce the number of development defects.

As described above, the solvent may further include components other than the components (M1) and (M2). In this case, the content of the components other than the component (M1) or (M2) is preferably in the range of 30% by mass or less, and more preferably 5% to 30% by mass with respect to the total mass of the solvent.

In addition, from the viewpoint that the amount of particles generated in the resist composition can be further reduced, as the solvent, one or more solvents selected from the group consisting of propylene glycol monomethyl ether acetate (PGMEA), propylene glycol monomethyl ether (PGME), ethyl lactate, cyclohexanone, and cyclopentanone are also preferably included.

A content of the solvent (F) in the resist composition of the embodiment of the present invention is preferably set such that the concentration of solid contents is 15% to 70% by mass.

The lower limit value of the concentration of solid contents of the resist composition is more preferably 20% by mass or more, still more preferably 25% by mass or more, and particularly preferably 30% by mass or more. In addition, the upper limit value is more preferably 60% by mass or less, still more preferably 55% by mass or less, and particularly preferably 50% by mass or less. Furthermore, the concentration of solid contents of the resist composition is a mass percentage of the mass of the component excluding the solvent with respect to the total mass of the resist composition.

«Acid Diffusion Control Agent (C)»

The resist composition may include an acid diffusion control agent (C).

The acid diffusion control agent (C) acts as a quencher that suppresses a reaction of an acid-decomposable resin in the unexposed area by excessive generated acids by trapping the acids generated from a photoacid generator (B) and the like upon exposure. For example, a basic compound (DA), a basic compound (DB) having basicity reduced or lost upon irradiation with radiation, an onium salt (DC) which is a relatively weak acid with respect to the photoacid generator (B), a low-molecular-weight compound (DD) having a nitrogen atom, and a group that leaves by the action of an acid, an onium salt compound (DE) having a nitrogen atom in a cationic moiety, can be used as the acid diffusion control agent (C).

In the resist composition, a known acid diffusion control agent can be appropriately used. For example, the known compounds disclosed in paragraphs [0627] to [0664] of US2016/0070167A, paragraphs [0095] to [0187] of US2015/0004544A, paragraphs [0403] to [0423] of US2016/0237190A, and paragraphs [0259] to [0328] of US2016/0274458A can be suitably used as the acid diffusion control agent (C).

Examples of the basic compound (DA) include the repeating units described in paragraphs 0188 to 0208 of JP2019-045864A.

In the resist composition, the onium salt (DC) which is a relatively weak acid with respect to the photoacid generator (B) can be used as the acid diffusion control agent (C).

In a case where the photoacid generator (B) and the onium salt that generates an acid which is a relatively weak acid with respect to an acid generated from the photoacid generator (B) are mixed and used, an acid generated from the photoacid generator (B) upon irradiation with actinic rays or radiation produces an onium salt having a strong acid anion by discharging the weak acid through salt exchange in a case where the acid collides with an onium salt having an unreacted weak acid anion. In this process, the strong acid is exchanged with a weak acid having a lower catalytic ability, and thus, the acid is apparently deactivated and the acid diffusion can be controlled.

Examples of the onium salt that is relatively weak acid with respect to the photoacid generator (B) include the onium salts described in paragraphs 0226 to 0233 of JP2019-070676A.

In a case where the resist composition includes an acid diffusion control agent (C), a content of the acid diffusion control agent (C) (a total content in a case where a plurality of kinds of the acid diffusion control agents (C) are present) is preferably 0.01% to 10.0% by mass, and more preferably 0.01% to 5.0% by mass with respect to the total solid content of the composition.

In the resist composition, the acid diffusion control agents (C) may be used alone or in combination of two or more kinds thereof.

«Plasticizer (D)»

The resist composition may include a plasticizer (D).

In a case where the resist composition includes the plasticizer (D), the plasticity of a resist film thus formed is improved, and as a result, the solvent in the film is easily volatilized, for example, during pre-baking (PB) before exposure.

Examples of the plasticizer (D) include a compound having a poly(oxyalkylene) structure. In the compound having a poly(oxyalkylene) structure, an oxyalkylene unit preferably has 2 to 6 carbon atoms, and more preferably has 2 or 3 carbon atoms. In addition, an average number of oxyalkylene units added is preferably 2 to 10, and more preferably 2 to 6.

Moreover, the compound having a poly(oxyalkylene) structure preferably has a polar group such as a hydroxyl group, a carboxyl group, and an amino group. Since the compound having a poly(oxyalkylene) structure has the above-mentioned polar group, after the resist film is exposed and developed, the polar group in the compound having the poly(oxyalkylene) structure and a polar group in the resin are easily bonded to each other due to an electrostatic interaction, and the film density of a pattern thus formed is more excellent.

Specific examples of the plasticizer (D) include the following ones.

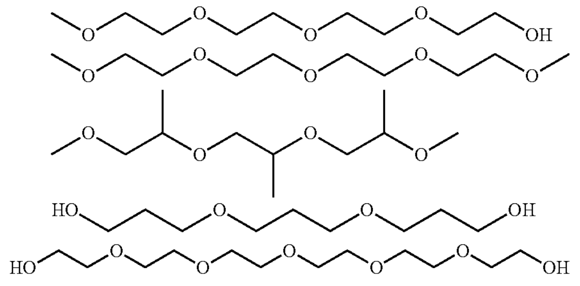

In a case where the resist composition includes the plasticizer (D), a content of the plasticizer (D) (a total content in a case where a plurality of kinds of the plasticizers (D) are included) is 1% by mass or more, more preferably 3% by mass or more, and still more preferably 5% by mass or more with respect to the total solid content of the composition. In addition, the upper limit is, for example, 30% by mass or less, and preferably 25% by mass or less.

In the resist composition, the plasticizers (D) may be used alone or in combination of two or more kinds thereof.

«Surfactant (E)»

The resist composition may include a surfactant (E). By incorporating the surfactant (E), it is possible to form a pattern having more excellent adhesiveness and fewer development defects.

As the surfactant (E), fluorine-based and/or silicon-based surfactants are preferable.

Examples of the fluorine-based and/or silicon-based surfactant include the surfactants described in paragraph [0276] of US2008/0248425A. In addition, EFTOP EF301 or EF303 (manufactured by Shin-Akita Chemical Co., Ltd.); FLUORAD FC430, 431, or 4430 (manufactured by Sumitomo 3M Inc.); MEGAFACE F171, F173, F176, F189, F113, F110, F177, F120, or R08 (manufactured by DIC Corporation); SURFLON S-382, SC101, 102, 103, 104, 105, or 106 (manufactured by Asahi Glass Co., Ltd.); TROYSOL S-366 (manufactured by Troy Corporation); GF-300 or GF-150 (manufactured by Toagosei Co., Ltd.); SURFLON S-393 (manufactured by AGC Seimi Chemical Co., Ltd.); EFTOP EF121, EF122A, EF122B, RF122C, EF125M, EF135M, EF351, EF352, EF801, EF802, or EF601 (manufactured by JEMCO Inc.); PF636, PF656, PF6320, or PF6520 (manufactured by OMNOVA Solutions Inc.); KH-20 (manufactured by Asahi Kasei Corporation); or FTX-204G, 208G, 218G, 230G, 204D, 208D, 212D, 218D, or 222D (manufactured by NEOS COMPANY LIMITED) may be used. In addition, a polysiloxane polymer KP-341 (manufactured by Shin-Etsu Chemical Co., Ltd.) can also be used as the silicon-based surfactant.

Moreover, the surfactant (E) may be synthesized using a fluoroaliphatic compound manufactured using a telomerization method (also referred to as a telomer method) or an oligomerization method (also referred to as an oligomer method), in addition to the known surfactants as shown above. Specifically, a polymer including a fluoroaliphatic group derived from fluoroaliphatic compound may be used as the surfactant (E). This fluoroaliphatic compound can be synthesized, for example, by the method described in JP2002-90991A.

As the polymer having a fluoroaliphatic group, a copolymer of a monomer having a fluoroaliphatic group and (poly(oxyalkylene))acrylate and/or (poly(oxyalkylene)) methacrylate is preferable, and the polymer may be unevenly distributed or block-copolymerized. Furthermore, examples of the poly(oxyalkylene) group include a poly (oxyethylene) group, a poly(oxypropylene) group, and a poly(oxybutylene) group, and the group may also be a unit such as those having alkylenes having different chain lengths within the same chain length such as poly(block-linked oxyethylene, oxypropylene, and oxyethylene) and poly(block-linked oxyethylene and oxypropylene). In addition, the copolymer of a monomer having a fluoroaliphatic group and (poly(oxyalkylene))acrylate (or methacrylate) is not limited only to a binary copolymer but may also be a ternary or higher copolymer obtained by simultaneously copolymerizing monomers having two or more different fluoroaliphatic groups or two or more different (poly(oxyalkylene)) acrylates (or methacrylates).

Examples of a commercially available surfactant thereof include MEGAFACE F178, F-470, F-473, F-475, F-476, and F-472 (manufactured by DIC Corporation), a copolymer of acrylate (or methacrylate) having a $C_6F_{13}$ group and (poly(oxyalkylene))acrylate (or methacrylate), and a copolymer of acrylate (or methacrylate) having a $C_3F_7$ group, (poly(oxyethylene))acrylate (or methacrylate), and (poly (oxypropylene))acrylate (or methacrylate).

In addition, a surfactant other than the fluorine-based surfactant and/or the silicon-based surfactants described in paragraph [0280] of US2008/0248425A may be used.

These surfactants (E) may be used alone or in combination of two or more kinds thereof.

In a case where the resist composition includes the surfactant (E), a content of the surfactant (E) (a total content in a case where a plurality of kinds of the surfactants (E) are included) is preferably 0.0001% to 2% by mass, and more preferably 0.0005% to 1% by mass with respect to the total solid content of the composition.

«Other Additives»

The resist composition may further include a crosslinking agent, an alkali-soluble resin, a dissolution inhibiting compound, a dye, a photosensitizer, a light absorber, and/or a compound that accelerates a solubility in a developer.

[Pattern Forming Method]

The resist composition produced by the above-mentioned production method is used for pattern formation. Furthermore, the procedure of the pattern forming method using the resist composition is not particularly limited, but preferably has the following steps.

Step A: A step of forming a resist film on a substrate, using a resist composition produced by the above-mentioned production method Step B: A step of exposing the resist film Step C: A step of developing the exposed resist film using a developer to form a pattern Hereinafter, the procedure of each of the steps will be described in detail.

(Step A: Resist Film Forming Step)

The step A is a step of forming a resist film on a substrate, using a resist composition produced by the above-mentioned production method. Furthermore, the resist composition produced by the above-mentioned production method is as described above.

Examples of a method in which a resist film is formed on a substrate, using a resist composition include a method in which a resist composition is applied onto a substrate.

Incidentally, it is preferable that the resist composition before the application is filtered through a filter, as necessary. A pore size of the filter is preferably 0.1 μm or less, more preferably 0.05 μm or less, and still more preferably 0.03 μm or less. In addition, the filter is preferably a polytetrafluoroethylene-, polyethylene-, or nylon-made filter.

The resist composition can be applied onto a substrate (for example, silicon and silicon dioxide coating) as used in the manufacture of integrated circuit elements by a suitable application method such as ones using a spinner or a coater. As the application method, spin application using a spinner is preferable.

After the application of the resist composition, the substrate may be dried to form a resist film. In addition, various underlying films (an inorganic film, an organic film, or an antireflection film) may be formed on the underlayer of the resist film, as necessary.

Examples of the drying method include a heating method (pre-baking: PB). The heating may be performed using a unit included in an ordinary exposure machine and/or an ordinary development machine, and may also be performed using a hot plate or the like.

The heating temperature is preferably 80° C. to 150° C., and more preferably 80° C. to 140° C.

The heating time is preferably 30 to 1,000 seconds, and more preferably 40 to 800 seconds.

A film thickness of the resist film is not particularly limited, but is preferably 0.2 to 15 μm, and more preferably 1.0 to 15 μm.

Moreover, a topcoat may be formed on the upper layer of the resist film, using the topcoat composition.

It is preferable that the topcoat composition is not mixed with the resist film and can be uniformly applied onto the upper layer of the resist film.

The film thickness of the topcoat is preferably 10 to 200 nm, and more preferably 20 to 100 nm.

The topcoat is not particularly limited, a topcoat known in the related art can be formed by a method known in the related art, and for example, the topcoat can be formed in accordance with the description in paragraphs 0072 to 0082 of JP2014-059543A.

(Step B: Exposing Step)

The step B is a step of exposing the resist film.

Examples of the exposing method include a method of irradiating a resist film thus formed with radiation through a predetermined mask.

Examples of the radiation include infrared light, visible light, ultraviolet light, far ultraviolet light, extreme ultraviolet light, X-rays, and electron beams (EB), preferably a far ultraviolet light having a wavelength of 250 nm or less, more preferably a far ultraviolet light having a wavelength of 220 nm or less, and particularly preferably a far ultraviolet light having a wavelength of 1 to 200 nm, specifically, KrF excimer laser (248 nm), ArF excimer laser (193 nm), F2 excimer laser (157 nm), EUV (13 nm), X-rays, and EB, and among these, the KrF excimer laser (248 nm) is preferable.

It is preferable to bake (post-exposure bake: PEB) after exposure and before developing.

The heating temperature is preferably 80° C. to 150° C., and more preferably 80° C. to 140° C.

The heating time is preferably 10 to 1,000 seconds, and more preferably 10 to 180 seconds.

The heating may be performed using a unit included in an ordinary exposure machine and/or an ordinary development machine, and may also be performed using a hot plate or the like.

This step is also described as a post-exposure baking.

(Step C: Developing Step)

The step C is a step of developing the exposed resist film using a developer to form a pattern.

Examples of the developing method include a method in which a substrate is immersed in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously jetted onto a substrate rotating at a constant rate while scanning a developer jetting nozzle at a constant rate (a dynamic dispense method).

Furthermore, after the step of performing development, a step of stopping the development may be carried out while substituting the solvent with another solvent.

A developing time is not particularly limited as long as it is a period of time where the unexposed area of a resin is sufficiently dissolved, and is preferably 10 to 300 seconds, and more preferably 20 to 120 seconds.

The temperature of the developer is preferably 0° C. to 50° C., and more preferably 15° C. to 35° C.

Examples of the developer include an alkali developer and an organic solvent developer.

As the alkali developer, it is preferable to use an aqueous alkaline solution including an alkali. Among those, the aqueous solutions of the quaternary ammonium salts typified by tetramethylammonium hydroxide (TMAH) are preferable as the alkali developer. An appropriate amount of an alcohol, a surfactant, or the like may be added to the alkali developer. The alkali concentration of the alkali developer is usually 0.1% to 20% by mass. Furthermore, the pH of the alkali developer is usually 10.0 to 14.0.

The organic solvent developer is a developer including an organic solvent.

Examples of the organic solvent used in the organic solvent developer include known organic solvents, and include an ester-based solvent, a ketone-based solvent, an alcohol-based solvent, an amide-based solvent, an ether-based solvent, and a hydrocarbon-based solvent.

(Other Steps)

It is preferable that the pattern forming method includes a step of performing cleaning using a rinsing liquid after the step C.

Examples of the rinsing liquid used in the rinsing step after the step of performing development using the developer include pure water. Furthermore, an appropriate amount of a surfactant may be added to pure water.

An appropriate amount of a surfactant may be added to the rinsing liquid.

In addition, an etching treatment on the substrate may be carried out using a pattern formed as a mask. That is, the substrate (or the underlayer film and the substrate) may be processed using the pattern thus formed in the step C as a mask to form a pattern on the substrate.

A method for processing the substrate (or the underlayer film and the substrate) is not particularly limited, but a method in which a pattern is formed on a substrate by subjecting the substrate (or the underlayer film and the substrate) to dry etching using the pattern thus formed in the step C as a mask is preferable.

The dry etching may be one-stage etching or multi-stage etching. In a case where the etching is etching including a plurality of stages, the etchings at the respective stages may be the same treatment or different treatments.

For etching, any of known methods can be used, and various conditions and the like are appropriately determined according to the type of a substrate, usage, and the like. Etching can be carried out, for example, in accordance with Journal of The International Society for Optical Engineering (Proc. of SPIE), Vol. 6924, 692420 (2008), JP2009-267112A, and the like. In addition, the etching can also be carried out in accordance with the method described in "Chapter 4 Etching" in "Semiconductor Process Text Book, 4th Ed., published in 2007, publisher: SEMI Japan".

Among those, oxygen plasma etching is preferable as the dry etching.

It is preferable that various materials (for example, a solvent, a developer, a rinsing liquid, a composition for forming an antireflection film, and a composition for forming a topcoat) used in the production method and the resist composition of the embodiments of the present invention do not contain impurities such as metals. The content of the impurities included in these materials is preferably 1 ppm by mass or less, more preferably 10 ppb by mass or less, still more preferably 100 ppt by mass or less, particularly preferably 10 ppt by mass or less, and most preferably 1 ppt by mass or less. Here, examples of the metal impurities include Na, K, Ca, Fe, Cu, Mg, Al, Li, Cr, Ni, Sn, Ag, As, Au, Ba, Cd, Co, Mo, Zr, Pb, Ti, V, W, and Zn.

Examples of a method for removing impurities such as metals from the various materials include filtration using a filter. A pore diameter of the filter is preferably 0.20 μm or less, more preferably 0.05 μm or less, and still more preferably 0.01 μm or less.

As a material of the filter, a fluorine resin such as polytetrafluoroethylene (PTFE) and perfluoroalkoxy alkane (PFA), a polyolefin resin such as polypropylene and polyethylene, and a polyamide resin such as nylon 6 and nylon 66 are preferable. As the filter, a filter which has been washed with an organic solvent in advance may be used. In the step of filtration using a filter, a plurality of filters or a plurality of kinds of filters connected in series or in parallel may be used. In a case of using the plurality of kinds of filters, a combination of filters having different pore diameters and/or materials may be used. In addition, various materials may be filtered plural times, and the step of filtering plural times may be a circulation-filtration step. As the circulation-filtration step, for example, the method disclosed in JP2002-62667A is preferable.

As the filter, a filter having a reduced amount of elutes as disclosed in JP2016-201426A is preferable.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, or organic adsorbing materials such as activated carbon can be used. Examples of the metal adsorbent include those disclosed in JP2016-206500A.

In addition, examples of a method for reducing the impurities such as metals included in various materials include a method in which a raw material having a low metal content is selected as a raw material constituting various materials and the raw material constituting the various materials is subjected to filtration using a filter; and a method in which distillation and the like are performed under conditions suppressing contamination as much as possible by performing a lining or coating with a fluorine resin and the like in the inside of a device. Preferred conditions for the filtration using a filter performed on the raw materials constituting various materials are the same ones as the above-mentioned conditions.

In order to prevent impurities from being incorporated, it is preferable that various materials are stored in the container described in US2015/0227049A, JP2015-123351A, JP2017-13804A, or the like.

Various materials may be used after being diluted with the solvent.

EXAMPLES

Hereinbelow, the present invention will be described in more detail with reference to Examples. The materials, the amounts of materials used, the proportions, the treatment details, the treatment procedure, and the like shown in Examples below may be appropriately modified as long as the modifications do not depart from the spirit of the present invention. Therefore, the scope of the present invention should not be construed as being limited to Examples shown below.

[Manufacture of Resist Composition]

Hereinbelow, first, various components to be blended in the resist composition will be described.

[Various Components]

«Intermediate Solution»

Intermediate solutions shown in Table 4 will be described below.

The intermediate solutions (X-1 to X-12) shown in Table 4 are shown in Table 3.

Hereinbelow, various components included in the intermediate solution shown in Table 3 will be described, and then a method for preparing the intermediate solution will be described.

<Various Components>

(Photoacid Generator)

Photoacid generators (photoacid generators B-1 to B-5) shown in Table 3 are shown below. Incidentally, the following photoacid generators B-1 to B-5 are all solid raw materials (powdered).

(B-1)

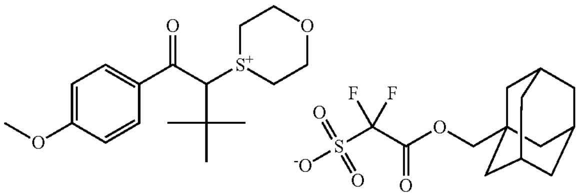

(B-2)

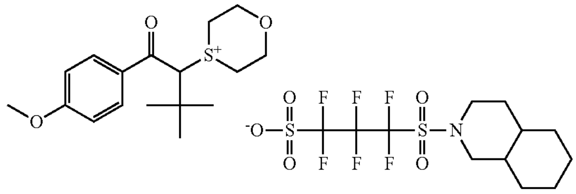

(B-3)

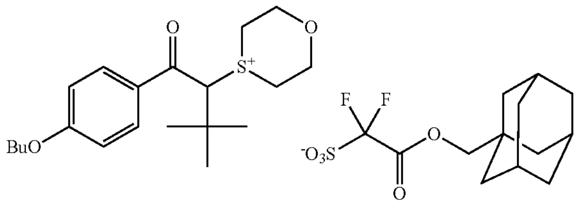

(B-4)

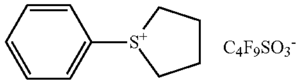

(B-5)

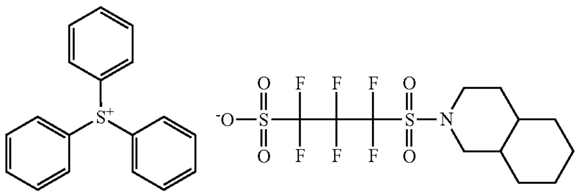

(Solvent)

Solvents shown in Table 3 are shown below.

PGME: Propylene glycol monomethyl ether (boiling point of 121° C.)

PGMEA: Propylene glycol monomethyl ether acetate (boiling point of 146° C.)

Butyl acetate: boiling point of 126° C.

Ethyl lactate: boiling point of 154° C.

Cyclohexanone: boiling point of 156° C.

Cyclopentanone: boiling point of 131° C.

<Solubility (g) of Photoacid Generator in 100 g of Solvent at 25° C.>

A solubility (g) of the photoacid generator in 100 g of a solvent at 25° C. was determined and classified based on the following standard. Furthermore, in a case of the intermediate solution X-1 in Table 3, the solubility (g) of the photoacid generator in 100 g of a solvent at 25° C. represents, for example, a solubility (g) of the photoacid generator B-3 in 100 g of PGME at 25° C. The evaluation is shown in Table 3.

(Standard)

"A": The solubility is more than 3 g

"B": The solubility is 0.5 to 3 g

"C": The solubility is less than 0.5 g

<Preparation of Intermediate Solution>

A solvent obtained by passing a solvent shown in Table 3 through a polyethylene filter having a pore size of 0.01 μm, and a photoacid generator shown in Table 3 were mixed so as to have a concentration shown in Table 3, and stirred for 8 hours such that the temperature was kept within ±2° C. from the set temperature in an environment at 23° C., thereby preparing intermediate solutions (solutions X-1 to X-12).

A viscosity (mPa·s) of the prepared intermediate solution at 25° C. was measured by the method described above.

TABLE 3

| Intermediate solution | Photoacid generator | Solvent (boiling point (° C.)) | Concentration of photoacid generator in intermediate solution | Solubility (25° C.) of photoacid generator in solvent | Viscosity (mPa · s) |
|---|---|---|---|---|---|
| X-1 | B-3 | PGME (121) | 10% by mass | A | 2.2 |
| X-2 | B-4 | PGME (121) | 10% by mass | A | 2.3 |
| X-3 | B-5 | PGME (121) | 10% by mass | A | 2.3 |
| X-4 | B-3 | PGMEA (146) | 20% by mass (suspension) | A | 3.9 |
| X-5 | B-2 | PGMEA (146) | 20% by mass (suspension) | B | 5.1 |
| X-6 | B-1 | PGMEA (146) | 20% by mass (suspension) | C | 4.2 |
| X-7 | B-1 | PGMEA (146) | 40% by mass (suspension) | C | 55 |
| X-8 | B-3 | Butyl acetate (126) | 10% by mass | A | 2.0 |
| X-9 | B-3 | PGMEA (146) | 70% by mass (suspension) | A | 70 |
| X-10 | B-3 | Ethyl lactate (154) | 10% by mass | A | 3.0 |
| X-11 | B-3 | Cyclohexanone (156) | 10% by mass | A | 2.5 |
| X-12 | B-3 | Cyclopentanone (131) | 10% by mass | A | 2.5 |

«Resin»

Resins (resins A-1 to A-3) shown in Table 4 are shown below.

As the resins A-1 to A-3, those synthesized based on known synthesis techniques were used.

Furthermore, the weight-average molecular weight (Mw) and the dispersity (Mw/Mn) of the resins A-1 to A-3 were measured by GPC (carrier: tetrahydrofuran (THF)) (an amount expressed in terms of polystyrene). In addition, the compositional ratio (ratio based on % by mole) of the resin was measured by $^{13}$C-nuclear magnetic resonance (NMR).

(A-1)

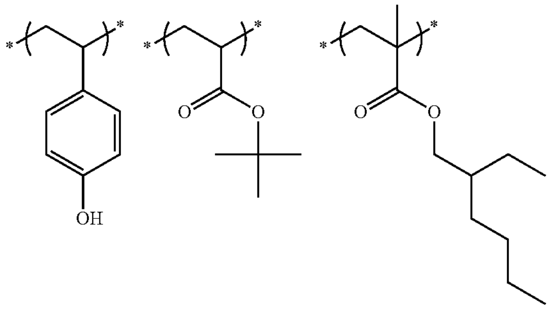

(A-2)

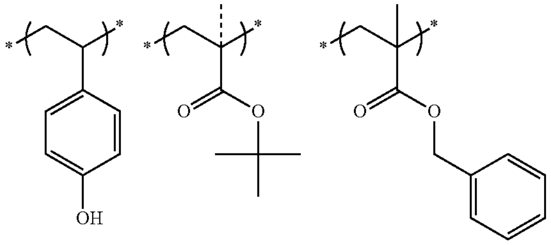

(A-3)

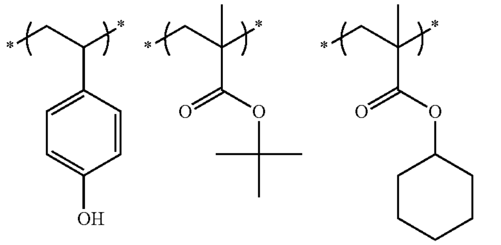

Furthermore, the ratio based on % by mole (shown in order from the left), the weight-average molecular weight (Mw), and the dispersity (Mw/Mn) of each repeating unit of the resins A-1 to A-3 are as follows.

Resin A-1:

Ratio based on % by mole of the respective repeating units: 60/19/21

Mw: 20,000

Mw/Mn: 1.5

Resin A-2:

Ratio based on % by mole of the respective repeating units: 60/30/10

Mw: 22,000

Mw/Mn: 1.4

Resin A-3:

Ratio based on % by mole of the respective repeating units: 60/30/10

Mw: 26,000

Mw/Mn: 1.6

«Acid Diffusion Control Agent»

The structures of acid diffusion control agents (C-1 to C-4) shown in Table 4 are shown below.

(C-1)

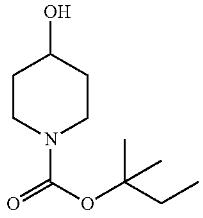

(C-2)

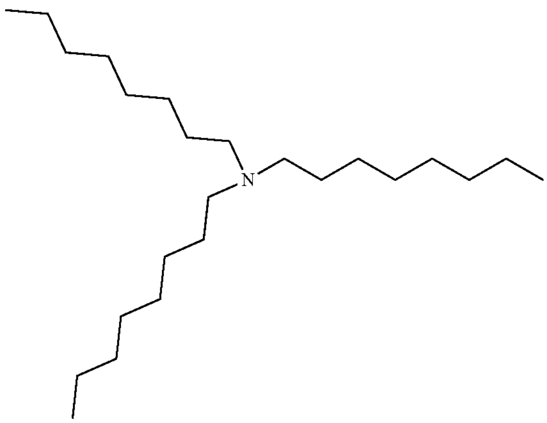

(C-3)

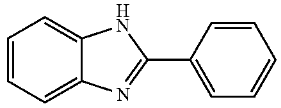

(C-4)

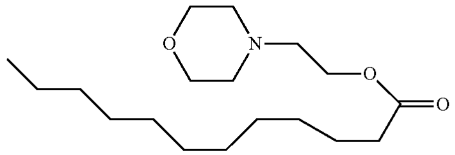

«Additive 1»

The structure of an additive 1 (additive D-1) shown in Table 4 is shown below.

(D-1)

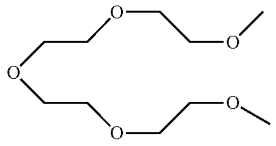

«Additive 2»

An additive 2 (additive E-1) (surfactant) shown in Table 4 is shown below.

"E-1": MEGAFACE R-41 (manufactured by DIC Corporation)

[Production of Resist Compositions 1 to 19]

A resist composition as shown in Table 4 which will be described later was prepared by performing an operation which will be described later in a clean room of Class 1000.

First, the respective components were charged into a stirring tank as shown in FIG. 1 arranged in the clean room so as to have the compositions of the resist compositions 1 to 19 described in Table 4. At that time, with regard to the charge of the solvent, the solvent was passed through a polyethylene filter having a pore size of 0.01 μm and charged into the stirring tank. In addition, with regard to the charge of the photoacid generator, the photoacid generator was charged into the stirring tank in the form of the above-mentioned intermediate solution. Furthermore, the intermediate solution was passed through a polyethylene filter having a pore size of 0.05 μm and then charged into the stirring tank. In addition, with regard to the charge of the resin, first, a part of the solvent used for preparing the resist composition was passed through a polyethylene filter having a pore size of 0.01 μm, and the resin was dissolved in the solvent which had been passed through the filter to prepare a diluted solution (dilution concentration: 50% by mass). Thereafter, the obtained diluted solution was passed through a polyethylene filter having a pore size of 0.1 μm and charged into the stirring tank. In addition, with regard to the charge of the solvent, the photoacid generator, and the components (the acid diffusion control agent, the additive 1, and the additive 2) other than the resin, the respective components were charged into the stirring tank. Specifically, a part of the solvent used for preparing the resist composition was passed through a polyethylene filter having a pore size of 0.01 μm, and the components (the acid diffusion control agent, the additive 1, and the additive 2) other than the solvent which had been passed through the filter were dissolved in advance to prepare a diluted solution (dilution concentration: 20% by mass). Thereafter, each diluted solution obtained was passed through a polyethylene filter with a size of 0.05 μm and charged into the stirring tank.

Next, as shown in FIG. 1, the stirring shaft to which the stirring blade was attached, arranged in the stirring tank, was rotated to stir and mix the respective components.

The temperature of the mixture at the time of stirring and mixing was set to 23° C. and adjusted so as to be kept within ±2° C. from a set temperature. In addition, the stirring and mixing time was set to 12 hours.

After completion of the stirring, the mixture in the stirring tank was fed to the circulation pipe connected to the stirring tank as shown in FIG. 1 by using a liquid feeding pump. Furthermore, the circulation pipe is a pipe in which one end is connected to the bottom part of the stirring tank and the other end is connected to the upper part of the stirring tank, a filter is arranged in the middle thereof, and filtration using the filter is carried out by circulating the circulation pipe. The circulation was carried out until the amount of liquid upon the passage of the mixture through the filter reached four times the total amount of liquid in the pipe.

Furthermore, for the type of the filter, a 2-stage filter composed of a filter consisting of polyethylene having a pore size of 0.02 μm and a nylon filter having a pore size of 0.15 μm was used.

After the circulation-filtration treatment was completed, the obtained resist composition was filled into a container for evaluation through a discharge pipe and a discharge nozzle as shown in FIG. 1. By the above-mentioned procedure, resist compositions 1 to 19 were obtained.

Furthermore, in the preparation of the resist composition 14, the concentration of the diluted solution of the resin was changed to 66.5% by mass.

[Production of Resist Composition 20]

A resist composition 20 was produced by the same methods as the above-mentioned resist compositions 1 to 19, except that the intermediate solution was not prepared in advance and the photoacid generator was charged into the stirring tank as a powder.

[Evaluation]

[Evaluation of Viscosity]

The viscosities of the prepared resist compositions 1 to 20 were measured by the method described above.

[Measurement of Number of Particles]

The number of particles per mL of the resist composition was determined by calculating the number of particles having a diameter of 0.3 μm or more included in 10 mL of the resist composition using a liquid particle counter (KS-18FX; manufactured by Rion Co., Ltd.).

In Table 4, the "Content" columns of "Resin", "Photoacid generator", "Acid diffusion control agent", and "Additive 1", and "Additive 2" each show a content (% by mass) of each component with respect to the total solid content in the resist composition. Furthermore, in the resist compositions 1 to 19, the photoacid generator was blended in the form of an intermediate solution such that the content (% by mass) with respect to the total solid content in the resist composition was a numerical value in Table 4.

In Table 4, the numerical value in the "Solvent" column shows a mass ratio of the contents of the respective components.

In Table 4, the "Concentration of solid contents" column shows a concentration (% by mass) of total solid contents in the resist composition.

In Table 4, in the "Structure of photoacid generator" column, a case where the photoacid generator is a compound having a phenacylsulfonium salt structure is represented by "A" or "B", and a case where the photoacid generator does not correspond to a compound having a phenacylsulfonium salt structure is represented by "-". In addition, in a case where the photoacid generator is the compound having a phenacylsulfonium salt structure, "A" represents a case where the photoacid generator corresponds to the above-mentioned compound represented by General Formula (ZI-5) and "B" represents a case where the photoacid generator does not correspond to the above-mentioned compound represented by General Formula (ZI-5).

TABLE 4

| Resist composition | Film thickness of resist film (μm) | Concentration of solid contents (% by mass) | Resin Type | Resin Content (% by mass) | Photoacid generator: Photoacid generator Type | Photoacid generator: Photoacid generator Content (% by mass) | Photoacid generator: Intermediate solution Type | Photoacid generator: Intermediate solution Concentration of photoacid generator in intermediate solution | Photoacid generator: Intermediate solution Solubility of photoacid generator in solvent (25° C.) |
|---|---|---|---|---|---|---|---|---|---|
| 1 | 12 | 41.7 | A-1 | 88.69 | B-3 | 1.2 | X-1 | 10% by mass | A |
| 2 | 12 | 47.6 | A-2 | 98.69 | B-3 | 1.2 | X-1 | 10% by mass | A |
| 3 | 12 | 47.6 | A-3 | 98.69 | B-3 | 1.2 | X-1 | 10% by mass | A |
| 4 | 12 | 41.7 | A-1 | 88.69 | B-4 | 1.2 | X-2 | 10% by mass | A |
| 5 | 12 | 41.7 | A-1 | 88.69 | B-5 | 1.2 | X-3 | 10% by mass | A |
| 6 | 12 | 41.7 | A-2 | 88.69 | B-3 | 1.2 | X-1 | 10% by mass | A |
| 7 | 12 | 41.7 | A-1 | 88.69 | B-3 | 1.2 | X-1 | 10% by mass | A |
| 8 | 12 | 41.7 | A-1 | 88.69 | B-3 | 1.2 | X-1 | 10% by mass | A |
| 9 | 12 | 41.7 | A-1 | 88.69 | B-3 | 1.2 | X-1 | 10% by mass | A |
| 10 | 12 | 42.7 | A-1 | 88.69 | B-3 | 1.2 | X-4 | 20% by mass (suspension) | A |
| 11 | 12 | 42.7 | A-1 | 88.69 | B-2 | 1.2 | X-5 | 20% by mass (suspension) | B |
| 12 | 12 | 42.7 | A-1 | 88.69 | B-1 | 1.2 | X-6 | 20% by mass (suspension) | C |
| 13 | 12 | 43.1 | A-1 | 86.89 | B-1 | 3.0 | X-7 | 40% by mass (suspension) | C |
| 14 | 18 | 51.0 | A-1 | 88.69 | B-3 | 1.2 | X-1 | 10% by mass | A |
| 15 | 12 | 41.7 | A-1 | 88.69 | B-3 | 1.2 | X-8 | 10% by mass | A |
| 16 | 12 | 43.5 | A-1 | 88.69 | B-3 | 1.2 | X-9 | 70% by mass (suspension) | A |
| 17 | 12 | 41.7 | A-1 | 88.69 | B-3 | 1.2 | X-10 | 10% by mass | A |
| 18 | 12 | 41.7 | A-1 | 88.69 | B-3 | 1.2 | X-11 | 10% by mass | A |
| 19 | 12 | 41.7 | A-1 | 88.69 | B-3 | 1.2 | X-12 | 10% by mass | A |
| 20 | 12 | 43.6 | A-1 | 88.69 | B-1 | 1.2 | — | — | — |

| Resist composition | Viscosity (mPa · s) | Acid diffusion control agent Type | Acid diffusion control agent Content (% by mass) | Additive 1 Type | Additive 1 Content (% by mass) | Additive 2 Type | Additive 2 Content (% by mass) | Solvent (each value is a blending mass ratio of solvent) PGMEA | Solvent PGME |
|---|---|---|---|---|---|---|---|---|---|
| 1 | 2.2 | C-1 | 0.026 | D-1 | 10.00 | E-1 | 0.085 | 51 | 49 |
| 2 | 2.2 | C-1 | 0.026 | D-1 | 0 | E-1 | 0.085 | 80 | 20 |
| 3 | 2.2 | C-]1 | 0.026 | D-1 | 0.00 | E-]1 | 0.085 | 80 | 20 |
| 4 | 2.3 | C-1 | 0.026 | D-1 | 10.00 | E-1 | 0.085 | 51 | 49 |
| 5 | 2.3 | C-1 | 0.026 | D-1 | 10.00 | E-1 | 0.085 | 51 | 49 |
| 6 | 2.2 | C-]1 | 0.026 | D-1 | 10.00 | E-1 | 0.085 | 51 | 49 |
| 7 | 2.2 | C-2 | 0.026 | D-1 | 10.00 | E-1 | 0.085 | 51 | 49 |
| 8 | 2.2 | C-3 | 0.026 | D-1 | 10.00 | E-1 | 0.085 | 51 | 49 |
| 9 | 2.2 | C-4 | 0.026 | D-1 | 10.00 | E-1 | 0.085 | 51 | 49 |
| 10 | 3.9 | C-1 | 0.026 | D-1 | 10.00 | E-1 | 0.085 | 51 | 49 |
| 11 | 5.1 | C-1 | 0.026 | D-1 | 10.00 | E-1 | 0.085 | 51 | 49 |
| 12 | 4.2 | C-1 | 0.026 | D-1 | 10.00 | E-1 | 0.085 | 51 | 49 |
| 13 | 55 | C-1 | 0.026 | D-1 | 10.00 | E-1 | 0.085 | 51 | 49 |
| 14 | 2.2 | C-1 | 0.026 | D-1 | 10.00 | E-1 | 0.085 | 51 | 49 |
| 15 | 2.0 | C-]1 | 0.026 | D-1 | 10.00 | E-1 | 0.085 | 51 | — |
| 16 | 70 | C-1 | 0.026 | D-1 | 10.00 | E-1 | 0.085 | 51 | 49 |
| 17 | 3.0 | C-]1 | 0.026 | D-1 | 10.00 | E-1 | 0.085 | 51 | — |
| 18 | 2.5 | C-1 | 0.026 | D-1 | 10.00 | E-1 | 0.085 | 51 | — |
| 19 | 2.5 | C-1 | 0.026 | D-1 | 10.00 | E-1 | 0.085 | 51 | — |
| 20 | — | C-1 | 0.026 | D-1 | 10.00 | E-1 | 0.085 | 51 | 49 |

| Resist composition | Solvent (each value is a blending mass ratio of solvent) Butyl acetate | Solvent Ethyl lactate | Solvent Cyclo-hexanone | Solvent Cyclo-pentanone | Viscosity of resist composition (mPa · s) | Difference in Viscosities between intermediate solution and resist composition (mPa · s) | Structure of photoacid generator | Evaluation results Number of particles in size of 0.3 μm or more per mL of resist composition (number) | Note |
|---|---|---|---|---|---|---|---|---|---|
| 1 | — | — | — | — | 352 | 350 | A | <1 | Example |
| 2 | — | — | — | — | 340 | 338 | A | <1 | Example |
| 3 | — | — | — | — | 335 | 333 | A | <1 | Example |

TABLE 4-continued

| | | | | | | | | | |
|---|---|---|---|---|---|---|---|---|---|
| 4 | — | — | — | — | 355 | 353 | — | <1 | Example |
| 5 | — | — | — | — | 352 | 350 | — | <1 | Example |
| 6 | — | — | — | — | 330 | 328 | A | <1 | Example |
| 7 | — | — | — | — | 349 | 347 | A | <1 | Example |
| 8 | — | — | — | — | 345 | 343 | A | <1 | Example |
| 9 | — | — | — | — | 348 | 346 | A | <1 | Example |
| 10 | — | — | — | — | 352 | 348 | A | 5 | Example |
| 11 | — | — | — | — | 350 | 345 | B | 10 | Example |
| 12 | — | — | — | — | 348 | 344 | B | 30 | Example |
| 13 | — | — | — | — | 352 | 297 | B | 70 | Example |
| 14 | — | — | — | — | 750 | 748 | A | 120 | Example |
| 15 | 49 | — | — | — | 400 | 398 | A | 80 | Example |
| 16 | — | — | — | — | 362 | 292 | A | 85 | Example |
| 17 | — | 49 | — | — | 375 | 372 | A | <1 | Example |
| 18 | — | — | 49 | — | 350 | 348 | A | <1 | Example |
| 19 | | | — | 49 | 355 | 353 | A | <1 | Example |
| 20 | — | — | — | — | 350 | — | B | 200 | Comparative Example |

As shown in Table 4, it was confirmed that a desired effect can be obtained by the production method of the embodiment of the present invention.

In addition, from the comparison of the resist compositions 10 to 12, it was confirmed that in a case where the solubility of the photoacid generator in 100 g of the solvent at 25° C. is 0.5 g or more (preferably more than 3 g), the amount of the particles generated in the resist composition can be further reduced.

Moreover, from the comparison of the resist compositions 10 to 12, it was confirmed that in a case where the photoacid generator includes a compound having a phenacylsulfonium salt structure, the amount of particles generated in the resist composition can be further reduced in the case where the compound having the phenacylsulfonium salt structure is the compound represented by General Formula (ZI-5).

In addition, from the comparison of the resist compositions 1 to 3, 6 to 9, and 14, it was confirmed that in a case where the difference between the viscosity of the intermediate solution and the viscosity of the resist composition is 600 mPa·s or less, the amount of particles generated in the resist composition can be further reduced.

Moreover, from the comparison of the resist compositions 12 and 13, and the comparison of the resist compositions 1, 10, and 16, it was confirmed that in a case where the viscosity of the intermediate solution is 50 mPa·s or less, the amount of particles generated in the resist composition can be further reduced.

In addition, from the comparison of the resist compositions 1 to 3, 6 to 9, 15, and 17 to 19, it was confirmed that in a case where the solvent for the intermediate solution includes one or more selected from the group consisting of PGMEA, PGME, ethyl lactate, cyclohexanone, and cyclopentanone, the amount of particles generated in the resist composition can be further reduced.

[KrF Exposure Experiment]

(Pattern Formation)

Using a spin coater "ACT-8" manufactured by Tokyo Electron Limited, an antireflection film was not provided on a silicon wafer (8-inch diameter) treated with HMDS (hexamethyldisilazane), and each of the prepared resist compositions (resist compositions 1 to 19) was applied to the wafer and baked (PB) at 130° C. for 180 seconds, thereby forming a resist film having a film thickness corresponding to each resist composition shown in Table 4.

The obtained resist film was subjected to pattern exposure through a mask having a line-and-space pattern such that a space width and a pitch width of the pattern were 5 μm and 20 μm, respectively, using a KrF excimer laser scanner (manufactured by ASML; PAS5500/850C, wavelength 248 nm, NA=0.60, σ=0.75).

The resist film after exposure was baked (PEB) at 120° C. for 60 seconds, developed with a developer (2.38% TMAH solution) for 60 seconds and spin-dried to obtain an isolated space pattern having a space width of 5 μm and a pitch width of 20 μm.

Furthermore, a scanning electron microscope (938011 manufactured by Hitachi High-Technologies Corporation) was used for the measurement of a pattern size.

It was confirmed that all of the formed patterns had a shape having good verticality and rectangularity.

EXPLANATION OF REFERENCES

10: stirring tank
12: stirring shaft
14: stirring blade
16: circulation pipe
18: filter
20: discharge pipe
22: discharge nozzle

What is claimed is:

1. A method for producing an actinic ray-sensitive or radiation-sensitive resin composition, comprising:
- preparing an intermediate solution which includes a photoacid generator and a solvent; and
- mixing the intermediate solution with at least a resin having a polarity that increases by the action of an acid to prepare an actinic ray-sensitive or radiation-sensitive resin composition having a viscosity of 10 mPa·s or more.

2. The method for producing an actinic ray-sensitive or radiation-sensitive resin composition according to claim 1, wherein a viscosity of the intermediate solution is 50 mPa·s or less.

3. The method for producing an actinic ray-sensitive or radiation-sensitive resin composition according to claim 1, wherein a difference in viscosities between the intermediate solution and the actinic ray-sensitive or radiation-sensitive resin composition having a viscosity of 10 mPa·s or more is 50 to 600 mPa· s.

4. The method for producing an actinic ray-sensitive or radiation-sensitive resin composition according to claim 1, wherein in preparing the intermediate solution, a solubility of the photoacid generator in 100 g of the solvent at 25° C. is 0.5 g or more.

5. The method for producing an actinic ray-sensitive or radiation-sensitive resin composition according to claim 1, wherein the solvent includes one or more solvents selected from the group consisting of propylene glycol monomethyl ether acetate, propylene glycol monomethyl ether, ethyl lactate, cyclohexanone, and cyclopentanone.

6. The method for producing an actinic ray-sensitive or radiation-sensitive resin composition according to claim 1, wherein the photoacid generator includes a compound represented by General Formula (ZI-5), (ZI-5)

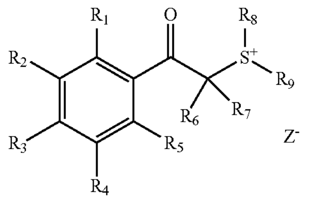

in the formula, $R_1$ to $R_5$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, provided that at least one of $R_1$, $R_2$, $R_3$, $R_4$, and $R_5$ is an alkyl group having 3 or more carbon atoms or an alkoxy group having 3 or more carbon atoms, $R_6$ and $R_7$ each independently represent a hydrogen atom, an alkyl group, a cycloalkyl group, a halogen atom, a cyano group, or an aryl group, $R_8$ and $R_9$ each independently represent an alkyl group, a cycloalkyl group, or an alkenyl group, any two or more of $R_1$, $R_5$, $R_6$, or $R_7$, and $R_8$ and $R_9$ may be bonded to each other to form a ring, and $Z^-$ represents an anion.

7. A pattern forming method comprising:

forming a resist film on a substrate, by using an actinic ray-sensitive or radiation-sensitive resin composition obtained by the method for producing an actinic ray-sensitive or radiation-sensitive resin composition according to claim 1;

exposing the resist film; and developing the exposed resist film, by using a developer.

* * * * *